United States Patent
Lee et al.

(10) Patent No.: US 9,155,146 B2
(45) Date of Patent: Oct. 6, 2015

(54) LIGHT SOURCE APPARATUS AND LIGHT EMITTING DIODE PACKAGE

(71) Applicant: SAMSUNG ELECTRONICS CO., LTD., Suwon-Si, Gyeonggi-do (KR)

(72) Inventors: Seung Woo Lee, Gyeonggi-do (KR); Sun Ki Kim, Gyeonggi-do (KR); Kyung Pil Nam, Gyeonggi-do (KR); Sung Min Jang, Gyeonggi-do (KR); Ki Won Choi, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 61 days.

(21) Appl. No.: 14/022,143

(22) Filed: Sep. 9, 2013

(65) Prior Publication Data

US 2014/0070714 A1    Mar. 13, 2014

Related U.S. Application Data

(63) Continuation-in-part of application No. 14/020,725, filed on Sep. 6, 2013.

(30) Foreign Application Priority Data

Sep. 7, 2012 (KR) .......... 10-2012-0099585

(51) Int. Cl.
*H05B 37/00* (2006.01)
*H05B 33/08* (2006.01)
*H01L 33/50* (2010.01)
*H01L 33/08* (2010.01)
(Continued)

(52) U.S. Cl.
CPC ........ *H05B 33/0818* (2013.01); *H05B 33/0827* (2013.01); *H01L 33/08* (2013.01); *H01L 33/16* (2013.01); *H01L 33/38* (2013.01); *H01L 33/382* (2013.01); *H01L 33/504* (2013.01); *H01L 2224/48091* (2013.01); *H01L 2224/49107* (2013.01); *H01L 2924/15174* (2013.01)

(58) Field of Classification Search
USPC .......... 315/185 R, 186, 209 R, 224, 225, 291, 315/307, 308, 312
See application file for complete search history.

(56) References Cited

U.S. PATENT DOCUMENTS

| 5,287,372 | A | 2/1994 | Ortiz |
| 7,321,206 | B2 * | 1/2008 | Kang et al. .................... 315/291 |
| 2014/0070712 | A1 | 3/2014 | Lee et al. |

FOREIGN PATENT DOCUMENTS

| KR | 10-0963138 B1 | 6/2010 |
| KR | 10-096876 B1 | 7/2010 |

(Continued)

OTHER PUBLICATIONS

U.S. Appl. No. 14/020,725, filed Sep. 6, 2013.*

(Continued)

*Primary Examiner* — Jimmy Vu
(74) *Attorney, Agent, or Firm* — McDermott Will & Emery LLP

(57) ABSTRACT

There is provided a light source apparatus including at least one light emitting diode (LED) string including at least one light emitting diode and at least one inductance unit for generating an induced current according to a change in a current applied to the light emitting diode. A main switch controls power applied to the LED string according to an on/off switching operation A capacitor is charged with a voltage of the power applied to the LED string when the main switch is switched on, and applies the charged voltage to the LED string when the main switch is switched off.

12 Claims, 19 Drawing Sheets

(51) Int. Cl.
*H01L 33/16* (2010.01)
*H01L 33/38* (2010.01)

(56) References Cited

FOREIGN PATENT DOCUMENTS

| KR | 2012-0012084 A | 2/2012 |
|---|---|---|
| KR | 2012-0031215 A | 3/2012 |

OTHER PUBLICATIONS

U.S. Office Action dated Jan. 15, 2015, issued in connection with corresponding U.S. Appl. No. 14/020,725. 11 pgs.

U.S. Office Action issued in related U.S. Appl. No. 14/020,725 on Jul. 17, 2015; 8 pages.

* cited by examiner

| PURPOSE | PHOSPHOR |
|---|---|
| LED TV BLU | $\beta$-SiAlON:$Eu^{2+}$<br>$(Ca,Sr)AlSiN_3$:$Eu^{2+}$<br>$L_3Si_6O_{11}$:$Ce^{3+}$ |
| ILLUMINATION | $Lu_3Al_5O_{12}$:$Ce^{3+}$<br>Ca-$\alpha$-SiAlON:$Eu^{2+}$<br>$L_3Si_6N_{11}$:$Ce^{3+}$<br>$(Ca,Sr)AlSiN_3$:$Eu^{2+}$<br>$Y_3Al_5O_{12}$:$Ce^{3+}$ |
| Side view<br>(Mobile, Note PC) | $Lu_3Al_5O_{12}$:$Ce^{3+}$<br>Ca $\alpha$ SiAlON:$Eu^{2+}$<br>$L_3Si_6N_{11}$:$Ce^{3+}$<br>$(Ca,Sr)AlSiN_3$:$Eu^{2+}$<br>$Y_3Al_5O_{12}$:$Ce^{3+}$<br>$(Sr,Ba,Ca,Mg)_2SiO_4$ |
| ELECTRICAL SYSTEM<br>OF VEHICLES<br>(Head Lamp etc.) | $Lu_3Al_5O_{12}$:$Ce^{3+}$<br>Ca-$\alpha$-SiAlON:$Eu^{2+}$<br>$L_3Si_6N_{11}$:$Ce^{3+}$<br>$(Ca,Sr)AlSiN_3$:$Eu^{2+}$<br>$Y_3Al_5O_{12}$:$Ce^{3+}$ |

FIG. 17

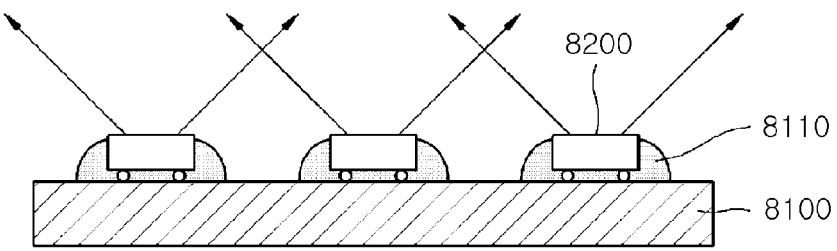

FIG. 18

LIGHT SOURCE APPARATUS AND LIGHT EMITTING DIODE PACKAGE

CROSS-REFERENCE TO RELATED APPLICATIONS

This application is a continuation-in-part of U.S. patent application Ser. No. 14/020,725 filed on Sep. 6, 2013, entitled "LIGHT SOURCE APPARATUS AND LIGHT EMITTING DIODE PACKAGE", which claims the priority to Korean Patent Application No. 10-2012-0099585 filed on Sep. 7, 2012, in the Korean Intellectual Property Office, the disclosure of which is incorporated herein by reference.

TECHNICAL FIELD

The present application relates to a light source apparatus and a light emitting diode package.

BACKGROUND

In order to drive a light emitting device having a light emitting diode (LED), a separate light source apparatus provided with an LED driving circuit is required. That is, since related art illumination lamps directly receive alternating current (AC) power to be driven, a separate light source apparatus is unnecessary, but an LED has characteristics such that it is driven by direct current (DC) power. In general, in an LED device, AC power is rectified, and in order to convert a DC signal rectified from the AC power to have a required magnitude, a DC/DC converter is included in a light source apparatus. Thus, demand for a scheme for miniaturization of a light source apparatus and an improvement in power efficiency under the conditions described above has been increased.

SUMMARY

An aspect of an exemplary embodiment provides a miniaturized light source apparatus having power consumption efficiency.

Another aspect of an exemplary embodiment provides a light emitting diode package having the light source apparatuses described above, disposed on an inside thereof to be distributed.

According to an aspect of an exemplary embodiment, there is provided a light source apparatus including: at least one light emitting diode (LED) string including at least one light emitting diode and at least one inductance unit generating an induced current according to a change in a current applied to the light emitting diode. A main switch controls power applied to the LED string according to an on/off switching operation. A capacitor is charged with a voltage of the power applied to the LED string when the main switch is switched on and the capacitor applies the charged voltage to the LED string when the main switch is switched off.

The light source apparatus may further include a controller for receiving an electrical signal output from the LED string to output a switching control signal, the main switch for performing an on/off switching operation in response to the switching control signal of the controller.

The controller may output a pulse width modulation (PWM) control signal as the switching control signal, and a PWM signal period of the switching control signal is set to be smaller as an inductance value of the inductance unit is decreased.

The light source apparatus may further includes a second switch controlling the power applied to the LED string from the main switch according an on/off switching operation, and the capacitor may be charged with the voltage of the power applied to the LED string when the main switch and the second switch are switched on, and may apply the charged voltage to the LED string when the main switch or the second switch is switched off.

When a set of the LED string, the main switch, the capacitor and the second switch is defined as a single light emitting series, the light emitting series may be at least two connected in parallel with each other.

The light emitting diode included in the LED string may be one, and when a set of the LED string, the main switch, the capacitor and the second switch is defined as a single light emitting object, the light emitting object may be provided in a plurality, connected to one another in series and in parallel.

The LED may include a light emitting laminate including a first conductivity-type semiconductor layer, an active layer, and a second conductivity-type semiconductor layer. First and second electrodes are electrically connected to the first conductivity-type semiconductor layer and the second conductivity-type semiconductor layer, respectively. The first electrode includes a plurality of conductive vias connected to the first conductivity-type semiconductor layer through the second conductivity-type semiconductor layer and the active layer. A radius of each of the plurality of conductive vias ranges from 5 μm to 50 μm, a space between conductive vias ranges from 100 μm to 500 μm. A sum total of the areas of the plurality of conductive vias in contact with the first conductivity-type semiconductor layer ranges from 1% to 5% of the area of the interface between the first conductivity-type semiconductor layer and the active layer. The plurality of conductive vias are disposed in rows and columns within the light emitting laminate.

The LED may include a substrate; a base layer formed on the substrate; a plurality of nano-light emitting structures formed on the base layer and including a first conductivity type nano-core, an active layer, and a second conductivity type semiconductor layer. A filler material fills gaps between the plurality of nano-light emitting structures.

The LED may include a first conductivity type semiconductor layer and a second conductivity type semiconductor layer. An active layer is interposed between the first and second conductivity type semiconductor layers. First and second electrodes are electrically connected to the first and second conductivity type semiconductor layers, respectively. At least one of the first and second electrodes includes a plurality of laminated metal layers including different elements.

The LED may further include a phosphor layer disposed in a light output path of the LED. The phosphor layer includes at least one phosphor selected from a yellow, red, and green phosphor, and the phosphor is at least one of an oxide-based phosphor, a silicate-based phosphor, a nitride-based phosphor, and a sulfide-based phosphor.

The LED may further include a phosphor disposed in a light output path of the LED, light output from the phosphor layer is white light. The white light has two or more peak wavelengths, (x, y) coordinates of the white light are positioned in a segment linking (x, y) coordinates (0.4476, 0.4074), (0.3484, 0.3516), (0.3101, 0.3162), (0.3128, 0.3292), (0.3333, 0.3333) in a CIE 1931 chromaticity diagram and black body radiation, and a color temperature of the white light corresponds to a range from 2,000K to 20,000K.

The LED and the main switch are mounted on a plate, the plate may include a metal support substrate; an insulating layer formed on the metal support substrate; and at least one of a conductive pattern and a copper foil laminated on the insulating layer.

The inductance unit may be disposed inside a circuit substrate while including a single-layer single conductive wire or a multilayer conductive layer of a helical structure, containing an inductance component.

The light source apparatus may further include a voltage stabilizer connected in parallel between an output terminal of the main switch and an input terminal of the second switch.

The light source apparatus may further include a first control unit receiving the electrical signal output from the LED string and outputting a first switching control signal, and a second control unit outputting a second switching control signal, and the main switch and the second switch may respectively perform an on/off switching operation in response to the first switching control signal and the second switching control signal.

In this case, the first control unit and the second control unit may output a first PWM control signal and a second PWM control signal as the first switching control signal and the second switching control signal, respectively. A signal period of the second PWM control signal may be longer than that of the first PWM control signal, and an on time of the second PWM control signal may be longer than an on time of the first PWM control signal.

When a set of the LED string, the capacitor and the second switch is defined as a single light emitting series, the light emitting series may be at least two connected in parallel with each other.

The light emitting diode included in the LED string may be one, and when a set of the LED string, the capacitor and the second switch is defined as a single light emitting object, the light emitting object may be provided in a plurality, connected to one another in series and in parallel.

According to another aspect of an exemplary embodiment, there is provided a light emitting diode package. The package may include: a light emitting diode having an anode terminal and a cathode terminal; a package substrate including a capacitor, an inductance unit, and a switching device having a control signal input terminal, and including the light emitting diode mounted thereon. An input terminal applies an electrical signal to the anode terminal of the light emitting diode. An output terminal receives the electrical signal output from the cathode terminal of the light emitting diode. A control terminal applies a control signal to the control signal input terminal of the switching device. At least one of the inductance unit is connected between the anode terminal of the light emitting diode and the input terminal or between the cathode terminal of the light emitting diode and the output terminal, and generates an inducted current according to a change in a current applied to the light emitting diode. The capacitor is connected in parallel with the light emitting diode, and the switching device performs an on/off switching operation in response to a control signal applied to the control signal input terminal from the control terminal so as to control the electrical signal applied to the light emitting diode.

The light emitting diode package may further include a lead out conductor embedded in the package substrate, and the anode terminal of the light emitting diode and the input terminal and the cathode terminal of the light emitting diode and the output terminal may be electrically connected to each other through the lead out conductor, respectively.

The input terminal, the output terminal, and the control terminal may be spaced apart from one another so as to be electrically isolated.

Additional advantages and novel features will be set forth in part in the description which follows, and in part will become apparent to those skilled in the art upon examination of the following and the accompanying drawings or may be learned by production or operation of the examples. The advantages of the present teachings may be realized and attained by practice or use of various aspects of the methodologies, instrumentalities and combinations set forth in the detailed examples discussed below.

BRIEF DESCRIPTION OF THE DRAWINGS

The above and other aspects, features and other advantages will be more clearly understood from the following detailed description taken in conjunction with the accompanying drawings, in which:

FIG. 17 is a view illustrating types of phosphors for application fields of white light emitting devices using a blue LED chip (440 to 460 nm).

FIG. 18 is view illustrating a mounting board on which a light emitting diode (LED) is mounted according to another exemplary embodiment;

DETAILED DESCRIPTION

Figure 1:
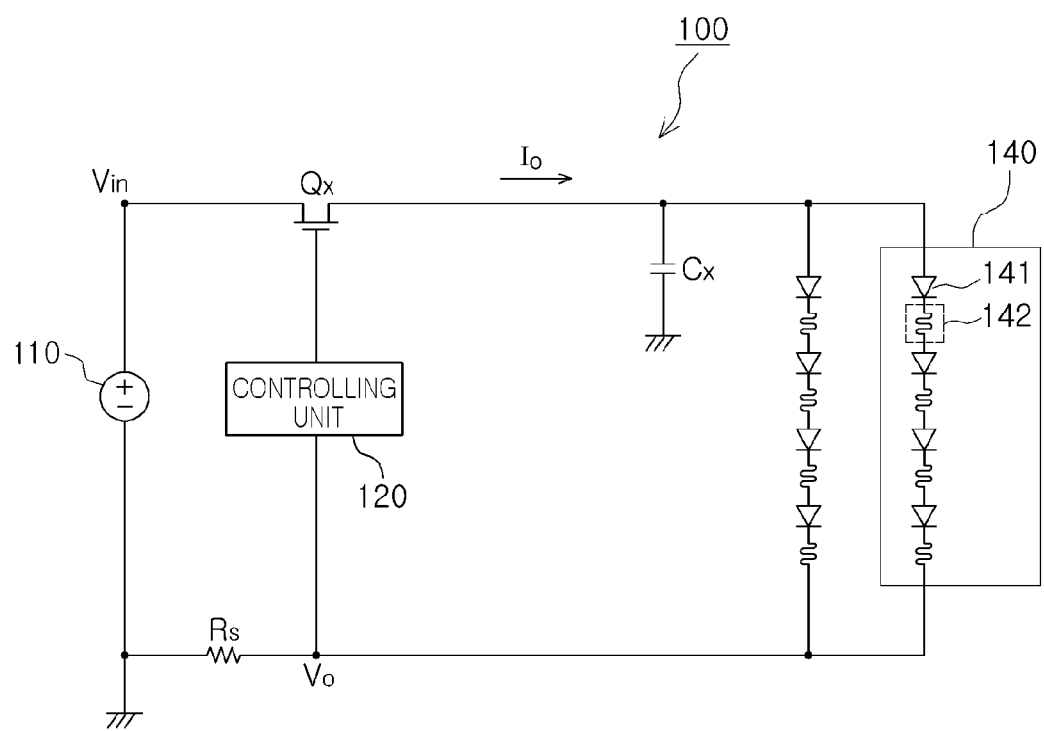
FIG. 1 is a circuit diagram of a light source apparatus according to an exemplary embodiment.

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and/or circuitry have been described at a relatively high-level, without detail, in order to avoid unnecessarily obscuring aspects of the present teachings.

Hereinafter, exemplary embodiments will be described in detail with reference to the accompanying drawings. The exemplary embodiments may, however, be embodied in many different forms and should not be construed as being limited to the embodiments set forth herein. Rather, these exemplary embodiments are provided so that this disclosure will be thorough and complete, and will fully convey the scope of the inventive concept to those skilled in the art.

In the drawings, the shapes and dimensions of elements may be exaggerated for clarity, and the same reference numerals will be used throughout to designate the same or like elements.

FIG. 1 is a circuit diagram of a light source apparatus according to an exemplary embodiment.

Referring to FIG. 1, a light source apparatus 100 according to an exemplary embodiment may include at least one light emitting diode (LED) string 140, a main switch Qx and a capacitor Cx.

The LED string 140 may include at least one light emitting diode 141 and at least one inductance unit 142 generating an induced current according to a change in a current applied to the light emitting diode 141.

The inductance unit 142 may include an inductance component to generate an induced current according to a magnitude of change in a current applied to the light emitting diode 141. The form (wave shape) of the inductance unit 142 shown in FIG. 1 is illustrated in the circuit diagram to allow for easy recognition of the inductance unit 142, regardless of an actual shape of the inductance unit 142. The inductance unit 142 will be described in detail below. In addition, the exemplary embodiment provides a structure in which two LED strings 140 respectively including four light emitting diodes 141 and four inductance units 142 are connected to each other in parallel, but the number of the LED strings 140 and the number of LEDs 141 included in the respective LED string 140 may be appropriately varied as needed.

The main switch Qx may control a power source 110 applied to the LED string 140 according to an on/off switching operation, and may perform a repeated switching operation itself without a switching control signal applied thereto and may also perform an on/off switching operation in response to a switching control signal applied from a controller outputting the switching control signal. In this case, the light source apparatus according to the exemplary embodiment may further include a controller 120 receiving an electrical signal output from the LED string 140 and outputting the received switching control signal.

Figure 2A:
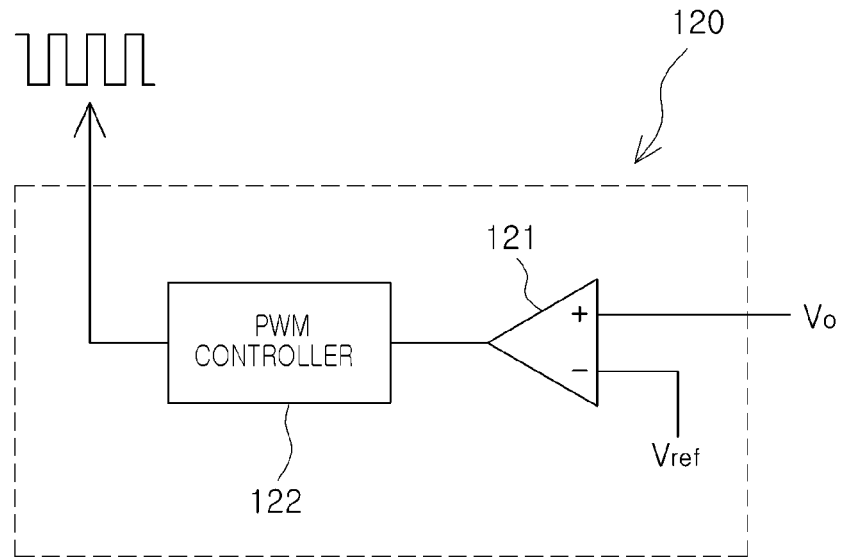
FIGS. 2A and 2B are circuit diagrams illustrating a controller according to an exemplary embodiment.

In detail, as shown in FIG. 2A, the controller 120 may include a comparator 121 for receiving an electrical signal output from the LED string 140 to compare the received electrical signal with a reference signal, for example, a reference voltage $V_{ref}$, and output a comparison result, and a pulse width modulation (PWM) controller 122 providing a pulse width-modulated (PWM) control signal for controlling the main switch Qx to the main switch Qx according to the comparison result from the comparator 121.

Figure 2B:
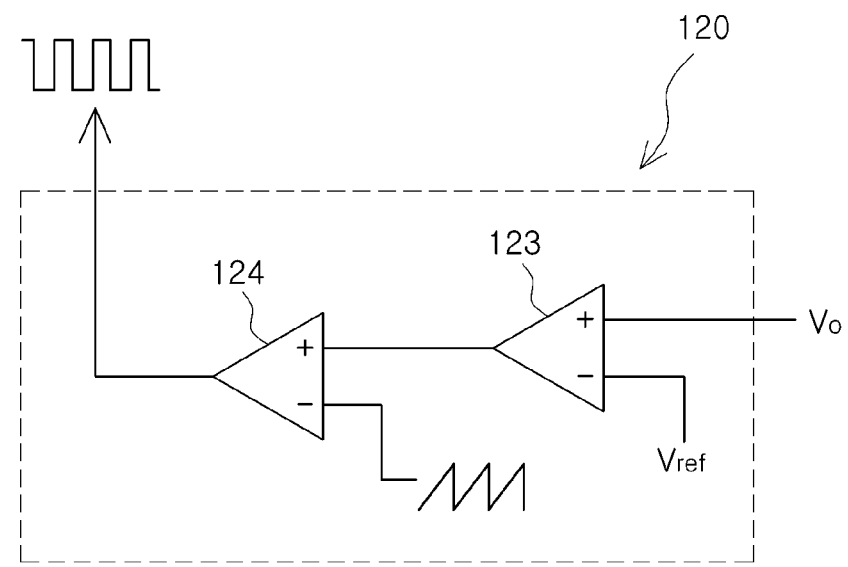

In addition, as shown in FIG. 2B, the controller 120 may include two comparators, that is, a first comparator 123 receiving an electrical signal output from the LED string 140 to compare the received electrical signal with the reference signal, for example, the reference voltage $V_{ref}$, and output a comparison result, and a second comparator 124 receiving an output signal from the first comparator 123 to compare the received output signal with a reference pulse and output a comparison result thereof. Here, the reference pulse may be a sawtooth waveform having a predetermined frequency.

The main switch Qx may be a switching device used in a direct current to direct current (DC/DC) converter, but is not limited thereto and thus, for example, a transistor may be used therefor.

The capacitor Cx may charge a voltage applied to the LED string 140 from the power source 110 when the main switch Qx is switched on, and may form a closed loop with the LED string 140 to be connected to each other when the main switch Qx is switched off such that the pre-charged voltage may be applied to the LED string 140.

First, operation according to the present embodiment will be described. In the present embodiment, the main switch Qx may receive a switching control signal, that is, a PWM control signal, from the controller 120 to repeatedly perform an on/off switching operation, and here, a switching control signal waveform may be as illustrated in FIG. 5A. Therefore, as the main switch Qx repeatedly performs the on/off switching operation, an electrical signal output from the main switch Qx may be measured as a waveform as illustrated in FIG. 5A, similarly to the switching control signal waveform. In a case in which a period of the waveform is represented by $t_{s1}$ and a switching on period is represented by $t_{s1}$, an overall average current Io applied to the LED string 140 may be defined by the following equation.

$$V_{in} \times \frac{t_{on1}}{t_{s1}} = \frac{I_o}{N} \times R_o \Rightarrow I_o = \frac{V_{in} t_{on1}}{R_o t_{s1}} N$$

(Here, N indicates the number of LED strings 140, and $R_o$ indicates a single equivalent resistor in the LED strings 140 connected to each other in series). That is, $I_o$ applied to the LED string 140 may be controlled by appropriately changing the period and an on-time duty ratio of the main switch Qx.

In detail, in the switching on period, a current may be applied to the respective LED strings 140 through the main switch Qx from the power source 110. Here, a portion of the current may be stored in the inductance unit 142 present in the LED string 140, as magnetic energy. In addition, a portion of voltage applied to the LED string 140 from the power source 110 may be charged as an electrical charge in the capacitor Cx.

When a switching off period begins, the LED string 140 may be opened from the power source, the capacitor Cx and the LED string 140 may form a closed loop, and magnetic energy stored in the inductance unit 142 may be discharged as a current to flow in the LED string 140. In order to allow a current to smoothly flow therethrough, the pre-charged charge of the capacitor Cx may provide a predetermined amount of voltage, and in this case, the current may flow through a positive (+) terminal of the capacitor Cx and the respective light emitting diodes 141 disposed in the LED string 140 from at least one or more inductance units 142.

Here, the capacitance of the capacitor Cx may not necessarily be higher, and the capacitor Cx having relatively low capacitance may be employed as long as it can help the current smoothly flow through the light emitting diodes 141 from the inductance units 142 in consideration of the dimension of the light source apparatus 100 or an increase in manufacturing costs due to the capacitor Cx. In addition, an embedded capacitor may be used, but is not limited thereto. The embedded capacitor will be described below.

The inductance unit 142 will be described in more detail below.

A magnetic field may generally be generated around a conductive wire through which current flows and a predetermined amount of parasitic inductance may be present therearound. The inductance unit 142 may be provided by setting the conditions with respect to a length or a thickness of the conductive wire, or the like, such that the inductance unit 142 may have a predetermined inductance value through the properties described above to generate an induced current for the light emitting diode 141. For example, the length or thickness of the conductive wire may be set to have inductance of about 300 nH to 4.7 μH.

Figure 3A:
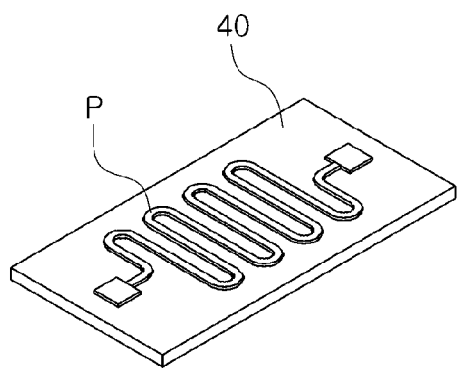
FIGS. 3A to 3D illustrate an inductance unit and a capacitor by way of example, according to an exemplary embodiment.
Figure 3B:
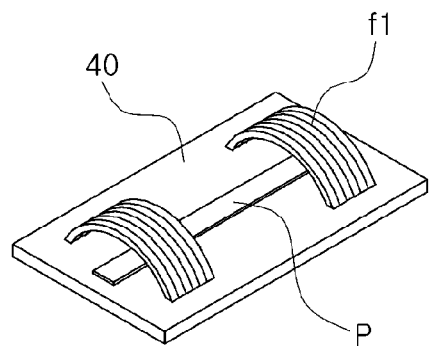
Figure 3C:
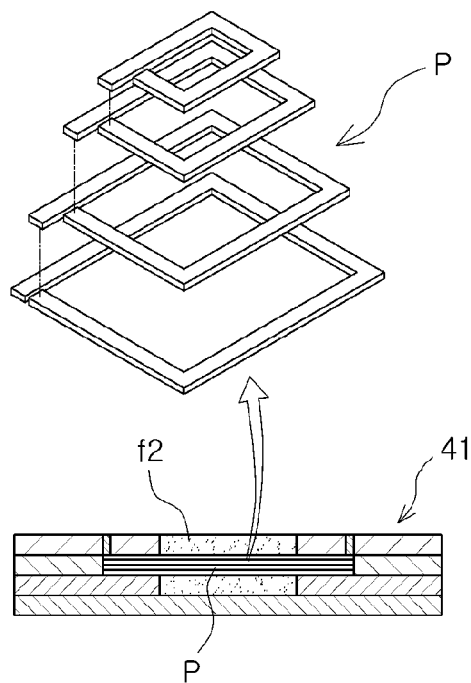

In more detail, FIGS. 3A to 3C illustrate the inductance unit 142 according to an exemplary embodiment by way of example.

With reference to FIGS. 3A and 3B, the inductance unit 142 according to the exemplary embodiment may be implemented by a single-layer single conductive wire. The single-layer single conductive wire may be implemented by a single conductive wire and may be obtained by forming a conductive pattern P of a printed circuit board 40 to be elongated as shown in FIG. 3A or by inserting a tube type ferrite bead f1 in the vicinity thereof to control an inductance value as shown in FIG. 3B.

In addition, the inductance unit 142 according to the exemplary embodiment may be implemented by forming conductive layers P having a spiral structure on a multilayer printed circuit board 41 as shown in FIG. 3C. The inductance unit 142 shown in FIG. 3C may have a structure in which the multilayer printed circuit board 41 formed of four layers, that is, insulators, is included therein and the conductive layers P having the multilayer spiral structure are formed on a second layer, but is not limited thereto. In addition, the inductance unit 142 may further include a via hole penetrating first to third layers and ferrite f2 formed in the via hole so as to control the inductance value to have a predetermined value.

As such, the inductance unit 142 may also be implemented to be included in the printed circuit board, and further, the light emitting diodes 141 included in the LED string 140 may be mounted on the printed circuit board such that at least one or more light emitting diodes 141 are connected to one another through a conductive pattern of the printed circuit board so as to have an array structure. As described above, FIGS. 3A to 3C illustrate the inductance unit 142 according to the exemplary embodiment by way of example, and thus are not limited thereto.

Meanwhile, the inductance unit 142 may have an inductance value lower than that of a general inductor device provided per separate device unit. Therefore, counter electromotive force generated in a switching off period of the main switch Qx, $$V_r = -L\frac{di}{dt}$$

($V_r$ refers to counter electromotive force and L and I respectively refer to an inductance and a through current of the inductance unit), that is, a magnitude of an absolute value of the counter electromotive force may have a sufficiently low value. That is, in this case, a free-wheeling diode for protecting different devices from the counter electromotive force may not be required in a circuit, but since an inductance value is a relatively low value, a generated amount of an induced current may be small as compared to that in a general inductor device provided for each device. However, the inductance unit 142 according to exemplary embodiment may be provided in each LED string 140, and thus, an induced current generated in each inductance unit 142 is not distributed to different LED strings 140, but may only flow in the respective LED strings 140 and thus an inductance (the generation of induced current) having a relatively high value is not necessarily required. However, the inductance value of the inductance unit 142 may also be set to have a required value by setting the length or thickness of the conductive wire.

In addition, in a case in which the inductance value of the inductance unit 142 is lower than a required value, an operation may be performed to be similar to that in the case in which the inductance value is relatively high, by increasing a frequency of power applied to the LED string. That is, frequency of an electrical signal applied to the LED string may be increased by setting the on/off switching period of the main switch Qx to be relatively short such that the light source apparatus 100 may only be smoothly driven by the inductance unit 142 having a relatively low inductance value, which may be implemented by setting a signal period of a switching control signal, for example, a PWM control signal, controlling the on/off switching operation to be relatively short in the main switch Qx.

Figure 3D:
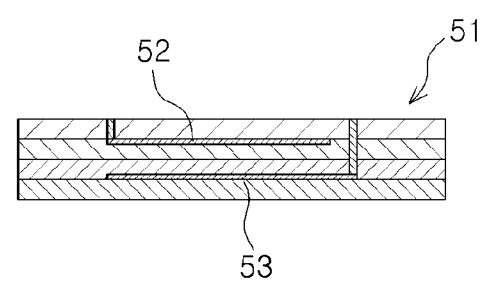

FIG. 3D illustrates an embedded capacitor described above. With reference to FIG. 3D, the embedded capacitor may be implemented by forming a conduction layer having a multilayer structure on a multilayer printed circuit board 51. In detail, the capacitor having an embedded structure may include a multilayer printed circuit board configured of four insulating layers and may employ a conductive layer 52 formed on a second layer and a conductive layer 53 formed on a third layer therein.

According to the exemplary embodiment, the light source apparatus 100 may include the inductance unit 142 included in the LED string 140 without a separate inductance device and a free-wheeling diode therein, such that the dimensions of the light source apparatus 100 may be effectively reduced.

Hereinafter, various types of light emitting diodes (LEDs) 141 that may be employed in the light emitting apparatus 100 according to an exemplary embodiment will be described in detail with reference to FIGS. 4 through 8.

FIGS. 4 through 8 are views illustrating a light emitting diode that may be employed in a light source apparatus according to an exemplary embodiment.

Figure 4:
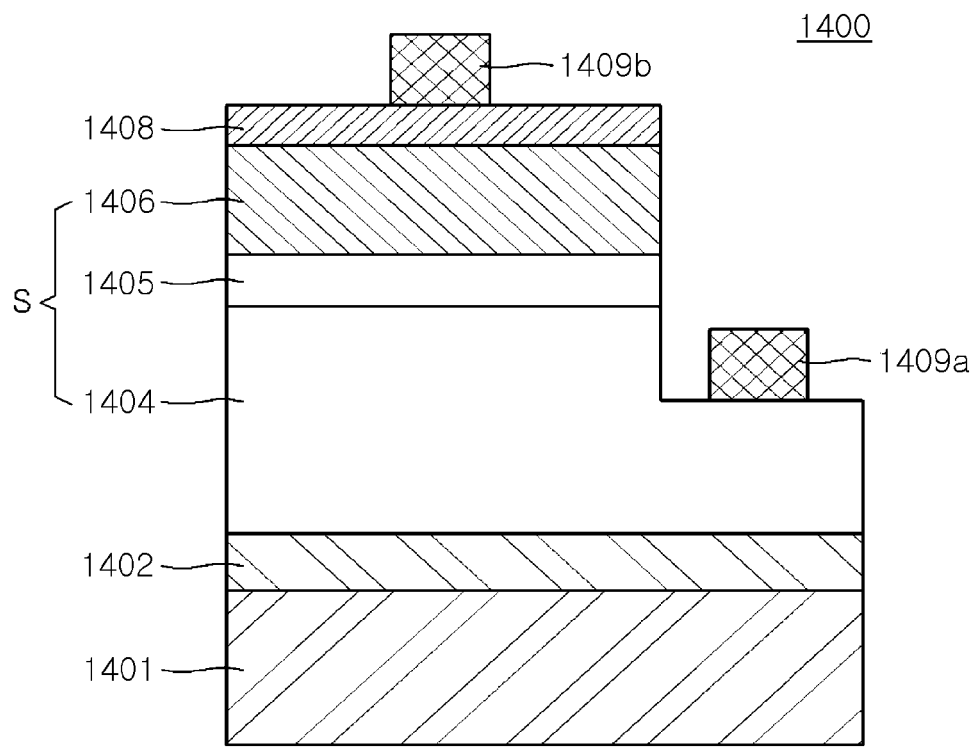
FIGS. 4 through 8 are views illustrating a light emitting diode that may be employed in a light source apparatus according to an exemplary embodiment.

As illustrated in FIG. 4, the LED 141 according to an exemplary embodiment may be provided as an LED chip 1400 including a light emitting laminate S formed on a semiconductor substrate 1401.

Here, the light emitting laminate S includes a first conductivity-type semiconductor layer 1404, an active layer 1405, and a second conductivity-type semiconductor layer 1406. The light emitting laminate S further includes an ohmic-contact layer 1408 formed on the second conductivity-type semiconductor layer 1406. A first electrode 1409a and a second electrode 1409b are formed on upper surfaces of the first conductivity-type semiconductor layer 1404 and the ohmic-contact layer 1408, respectively.

Hereinafter, major components of the LED chip 1400 will be described in detail.

As the substrate 1401, an insulating substrate, a conductive substrate, or a semiconductor substrate may be used as necessary. For example, the substrate 1401 may be made of sapphire, SiC, Si, $MgAl_2O_4$, MgO, $LiAlO_2$, $LiGaO_2$, GaN, or the like.

In the case of a sapphire substrate, sapphire is a crystal having Hexa-Rhombo R3c symmetry, of which lattice constants in c-axis and a-axis directions are approximately 13.001 Å and 4.758 Å, respectively, and has a C-plane (0001), an A-plane (1120), an R-plane (1102), and the like. In this case, a nitride thin film may be relatively easily grown on the C-plane of the sapphire crystal, and because sapphire crystal is stable at high temperatures, the sapphire substrate is commonly used as a nitride growth substrate. A silicon (Si) substrate may also be used. Since a silicon (Si) substrate is more appropriate for increasing a diameter and is relatively low in price, it may be used to facilitate mass-production.

Meanwhile, the substrate 1401 may be completely or partially removed or patterned during a chip fabrication process in order to enhance light or electrical characteristics of the LED chip before or after the LED structure is grown.

For example, in the case of a sapphire substrate, the substrate may be separated by irradiating a laser on an interface between the substrate and a semiconductor layer through the substrate, and in case of a silicon substrate or a silicon carbide substrate, the substrate may be removed through a method of polishing/etching, or the like.

Also, in removing the substrate, a different support substrate may be used, and in this case, the support substrate may be attached to the opposite side of the original growth substrate by using a reflective metal or a reflective structure may be inserted into a middle portion of a bonding layer to enhance light efficiency of the LED chip.

Referring to substrate patterning, an uneven surface or a sloped surface may be formed on a main surface (one surface or both surfaces) or a lateral surface of the substrate to enhance light extraction efficiency. A size of the pattern may be selected from within the range of 5 nm to 500 µm, and any pattern may be employed as long as it can enhance light extraction efficiency as a regular or an irregular pattern. The pattern may have various shapes such as a columnar shape, a peaked shape, a hemispherical shape, a polygonal shape, and the like.

Meanwhile, due to a lattice constant mismatch between a substrate material and a thin film material, dislocation density may be increased, and due to a difference between coefficients of thermal expansion, cracks and warpage may be generated.

In this case, in order to prevent dislocation of and cracks in the light emitting laminate S, a buffer layer 1402 may be disposed between the substrate 1401 and the light emitting laminate S. The buffer layer 1402 may serve to adjust a degree of warpage of the substrate when an active layer is grown, to reduce a wavelength distribution of a wafer.

The buffer layer may be made of AlxInyGa1−x−yN (0≤x≤1, 0≤y≤1), in particular, GaN, AlN, AlGaN, InGaN, or InGaNAlN, and a material such as $ZrB_2$, $HfB_2$, ZrN, HfN, TiN, or the like, may also be used as necessary. Also, the buffer layer may be formed by combining a plurality of layers or by gradually changing a composition.

In particular, a silicon (Si) substrate has a coefficient of thermal expansion significantly different from that of GaN, and thus, there is a high possibility of a defect being generated therein. In the case of a silicon substrate, a buffer layer having a composite structure may be used in order to control stress for restraining warpage as well as controlling a defect.

For example, first, an AlN layer is formed on the substrate 1401. In this case, a material not including gallium (Ga) may be used in order to prevent a reaction between silicon (Si) and gallium (Ga). Besides AlN, a material such as SiC, or the like, may also be used. The AlN layer is grown at a temperature ranging from 400° C. to 1,300° C. by using an aluminum (Al) source and a nitrogen (N) source. An AlGaN intermediate layer may be inserted into the middle of GaN between the plurality of AlN layers to control stress, as necessary.

The light emitting laminate S having a multilayer structure of a Group III nitride semiconductor will be described in detail. The first and second conductivity-type semiconductor layers 1404 and 1406 may be formed of n-type and p-type impurity-doped semiconductors, respectively. However, the exemplary embodiment is not limited thereto and, conversely, the first and second conductivity-type semiconductor layers 1404 and 1406 may be formed of p-type and n-type impurity-doped semiconductors. For example, the first and second conductivity-type semiconductor layers 1404 and 1406 may be made of a Group III nitride semiconductor, e.g., a material having a composition of AlxInyGa1−x−yN (0≤x≤1, 0≤y≤1, 0≤x+y≤1). Of course, the exemplary embodiment is not limited thereto and the first and second conductivity-type semiconductor layers 1404 and 1406 may also be made of a material such as an AlGaInP-based semiconductor or an AlGaAs-based semicondcutor.

Meanwhile, the first and second conductivity-type semiconductor layers 1404 and 1406 may have a unilayer structure, or, alternatively, the first and second conductivity-type semiconductor layers 1404 and 1406 may have a multilayer structure including layers having different compositions, thicknesses, and the like, as necessary. For example, the first and second conductivity-type semiconductor layers 1404 and 1406 may have a carrier injection layer for improving electron and hole injection efficiency, or may have various types of superlattice structures, respectively.

The first conductivity-type semiconductor layer 1404 may further include a current diffusion layer in a region adjacent to the active layer 1405. The current diffusion layer may have a structure in which a plurality of $In_xAl_yGa_{(1-x-y)}N$ layers having different compositions or different impurity contents are iteratively laminated or may have an insulating material layer partially formed therein.

The second conductivity-type semiconductor layer 1406 may further include an electron blocking layer in a region adjacent to the active layer 1405. The electron blocking layer may have a structure in which a plurality of $In_xAl_yGa_{(1-x-y)}N$ layers having different compositions are laminated or may have one or more layers including $Al_yGa_{(1-y)}N$. The electron blocking layer has a bandgap wider than that of the active layer 1405, thus preventing electrons from being transferred over the second conductivity-type p-type semiconductor layer.

The light emitting laminate S may be formed by using metal-organic chemical vapor deposition (MOCVD). In order to fabricate the light emitting laminate S, an organic metal compound gas (e.g., trimethyl gallium (TMG), trimethyl aluminum (TMA)) and a nitrogen-containing gas (ammonia ($NH_3$), or the like) are supplied as reactive gases into a reaction container in which the substrate 1401 is installed, the substrate is maintained at a high temperature ranging from 900° C. to 1,100° C., and while a gallium nitride-based compound semiconductor is being grown, an impurity gas is supplied as necessary to laminate the gallium nitride-based compound semiconductor as an undoped n-type or p-type semiconductor. Silicon (Si) is a well known n-type impurity and p-type impurity includes zinc (Zn), cadmium (Cd), beryllium (Be), magnesium (Mg), calcium (Ca), barium (Ba), and the like. Among them, magnesium (Mg) and zinc (Zn) may be mainly used.

Also, the active layer 1405 disposed between the first and second conductivity-type semiconductor layers 1404 and 1406 may have a multi-quantum well (MQW) structure in which a quantum well layer and a quantum barrier layer are alternately laminated. For example, in the case of a nitride semiconductor, a GaN/InGaN structure may be used, or a single quantum well (SQW) structure may also be used.

The ohmic-contact layer 1408 may have a relatively high impurity concentration to have low ohmic-contact resistance to lower an operating voltage of the element and enhance element characteristics. The ohmic-contact layer 1408 may be formed of a GaN layer, a InGaN layer, a ZnO layer, or a graphene layer.

The first or second electrode 1409a or 1409b may be made of a material such as silver (Ag), nickel (Ni), aluminum (Al), rhodium (Rh), palladium (Pd), iridium (Ir), ruthenium (Ru), magnesium (Mg), zinc (Zn), platinum (Pt), gold (Au), or the like, and may have a structure including two or more layers such as Ni/Ag, Zn/Ag, Ni/Al, Zn/Al, Pd/Ag, Pd/Al, Ir/Ag, Ir/Au, Pt/Ag, Pt/Al, Ni/Ag/Pt, or the like.

The LED chip illustrated in FIG. 4 has a structure in which first and second electrodes 1409a and 1409b face the same surface as a light extracting surface, but it may also be implemented to have various other structures, such as a flipchip structure in which first and second electrodes face a surface opposite to a light extracting surface, a vertical structure in which first and second electrodes are formed on mutually opposing surfaces, a vertical and horizontal structure employing an electrode structure by forming several vias in a chip as a structure for enhancing current spreading efficiency and heat dissipation efficiency, and the like.

Figure 5:
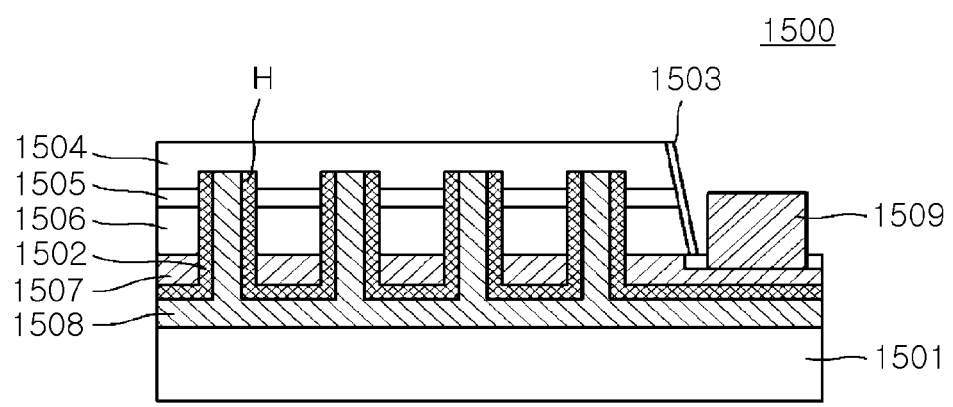

FIG. 5 illustrates a different type of LED 141 according to an exemplary embodiment.

The LED according to an embodiment of FIG. 5 may have more enhanced current spreading efficiency and heat dissipation efficiency.

In detail, as illustrated in FIG. 5, the LED 141 may be provided as an LED chip 1500. The LED chip 1500 may include a first conductivity-type semiconductor layer 1504, an active layer 1505, a second conductivity-type semiconductor layer 1506, a second electrode layer 1507, an insulating layer 1502, a first electrode layer 1508 and a substrate 1501 sequentially laminated.

Here, in order to be electrically connected to the first conductivity-type semiconductor layer 1504, the first electrode layer 1508 includes one or more contact holes H extending from one surface of the first electrode layer 1508 to at least a partial region of the first conductivity-type semiconductor layer 1504 and electrically insulated from the second conductivity-type semiconductor layer 1506 and the active layer 1505. However, the first electrode layer 1508 is not an essential element in the exemplary embodiment.

The contact hole H extends from an interface of the first electrode layer 1508, passing through the second electrode layer 1507, the second conductivity-type semiconductor layer 1506, and the active layer 1505, to the interior of the first conductivity-type semiconductor layer 1504. The contact hole H extends to at least an interface between the active layer 1505 and the first conductivity-type semiconductor layer 1504, and preferably, extends to a portion of the first conductivity-type semiconductor layer 1504.

However, the contact hole H is formed for electrical connectivity and current spreading, so the purpose of the presence of the contact hole H is achieved when it is in contact with the first conductivity-type semiconductor layer 1504. Thus, it is not necessary for the contact hole H to extend to an external surface of the first conductivity-type semiconductor layer 1504.

The second electrode layer 1507 formed on the second conductivity-type semiconductor layer 1506 may be made of a material selected from among silver (Ag), nickel (Ni), aluminum (Al), rhodium (Rh), palladium (Pd), iridium (Ir), ruthenium (Ru), magnesium (Mg), zinc (Zn), platinum (Pt), gold (Au), and the like, in consideration of a light reflecting function and an ohmic-contact function with the second conductivity-type semiconductor layer 1506, and may be formed by using a process such as sputtering, deposition, or the like.

The contact hole H may have a form penetrating the second electrode layer 1507, the second conductivity-type semiconductor layer 1506, and the active layer 1505 so as to be connected to the first conductivity-type semiconductor layer 1504. The contact hole H may be formed through an etching process, e.g., inductively coupled plasma-reactive ion etching (ICP-RIE), or the like.

The insulating layer 1502 is formed to cover a side wall of the contact hole H and a surface of the second conductivity-type semiconductor layer 1506. In this case, at least a portion of the first conductivity-type semiconductor layer 1504 corresponding to the bottom of the contact hole H may be exposed. The insulating layer 1502 may be formed by depositing an insulating material such as $SiO_2$, $SiO_xN_y$, or $Si_xN_y$.

The first electrode layer 1508 including a conductive via formed by filling a conductive material is formed within the contact hole H. Subsequently, the substrate 1501 is formed on the first electrode layer 1508. In this structure, the substrate 1501 may be electrically connected to the first conductivity-type semiconductor layer 1504 by a conductive via.

The substrate 1501 may be made of a material including any one of Au, Ni, Al, Cu, W, Si, Se, GaAs, SiAl, Ge, SiC, AlN, $Al_2O_3$, GaN, AlGaN and may be formed through a process such as plating, sputtering, deposition, bonding, or the like. But the exemplary embodiment is not limited thereto.

In order to reduce contact resistance, the amount, a shape, a pitch, a contact area with the first and second conductivity-type semiconductor layers 1504 and 1506, and the like, of the contact hole H may be appropriately regulated. The contact holes H may be arranged to have various shapes in rows and columns to improve current flow. In this case, the conductive via may be surrounded by the insulating layer 1502 so as to be electrically separated from the active layer 1505 and the second conductivity-type semiconductor layer 1506.

Meanwhile, preferably, the light source apparatus 100 according to the exemplary embodiment employs an LED chip having a low heating value, as the LED 141, in the aspect of heat dissipation performance.

As an LED chip satisfying such requirements, an LED chip including a nano-structure (hereinafter, referred to as a 'nano-LED chip') may be used as the LED 141.

Such a nano-LED chip includes a recently developed core/shell type nano-LED chip, which has a low binding density to generate a relatively low degree of heat, and has increased luminous efficiency by increasing a light emitting area by utilizing nano-structures, prevents a degradation of efficiency due to polarization by obtaining a non-polar active layer, thus improving drop characteristics such that luminous efficiency is reduced as an amount of injected current is increased.

A nano-LED chip 1600 is illustrated as another example of the LED 141 that may be employed in the foregoing light source apparatus 100.

Figure 6:
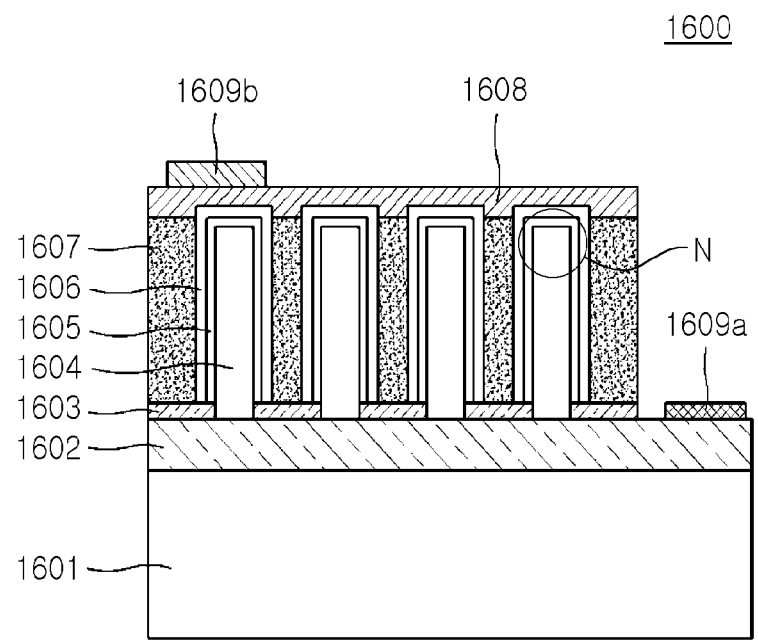

As illustrated in FIG. 6, the nano-LED chip 1600 includes a plurality of nano-light emitting structures N formed on a substrate 1601. In this example, it is illustrated that the nano-light emitting structure N has a core-shell structure as a rod structure, but the exemplary embodiment is not limited thereto and the nano-light emitting structure N may have a different structure such as a pyramid structure.

The nano-LED chip 1600 includes a base layer 1602 formed on the substrate 1601. The base layer 1602 is a layer providing a growth surface for the nano-light emitting structure N, which may be a first conductivity-type semiconductor. A mask layer 1603 having an open area for the growth of the nano-light emitting structure N (in particular, the core) may be formed on the base layer 1602. The mask layer 1603 may be made of a dielectric material such as $SiO_2$ or $SiN_x$.

In the nano-light emitting structure N, a first conductivity-type nano core 1604 is formed by selectively growing a first conductivity-type semiconductor by using the mask layer 1603 having an open area, and an active layer 1605 and a second conductivity-type semiconductor layer 1606 are formed as shell layers on a surface of the nano core 1604. Accordingly, the nano-light emitting structure N may have a core-shell structure in which the first conductivity-type semiconductor is a nano core and the active layer 1605 and the second conductivity-type semiconductor layer 1606 enclosing the nano core are shell layers.

The nano-LED chip 1600 includes a filler material 1607 filling spaces between the nano-light emitting structures N. The filler material 1607 may structurally stabilize the nano-light emitting structures N. The filler material 1607 may be made of a transparent material such as $SiO_2$, SiN, or a silicon resin. The filler material 1607 may also be made of a reflective material such as a polymer (e.g., nilon), a polyphthalamide (PPA) resin, perchloroethylene (PCE), silver (Ag), aluminum (Al), or the like, but the exemplary embodiment is not limited thereto. An ohmic-contact layer 1608 may be formed on the nano-light emitting structures N and connected to the second conductivity-type semiconductor layer 1606. The nano-LED chip 1600 includes the base layer 1602 formed of the first conductivity-type semiconductor and first and second electrodes 1609a and 1609b connected to the base layer 1602 and the ohmic-contact layer 1608, respectively.

By forming the nano-light emitting structures N such that they have different diameters, components, and doping densities, light beams having two or more different wavelengths may be emitted from the single element. By appropriately adjusting light beams having different wavelengths, white light may be implemented without using phosphors in the single element, and light beams having various desired colors or white light beams having different color temperatures may be implemented by combining a different LED chip to the foregoing element or combining wavelength conversion materials such as phosphors.

Figure 7:
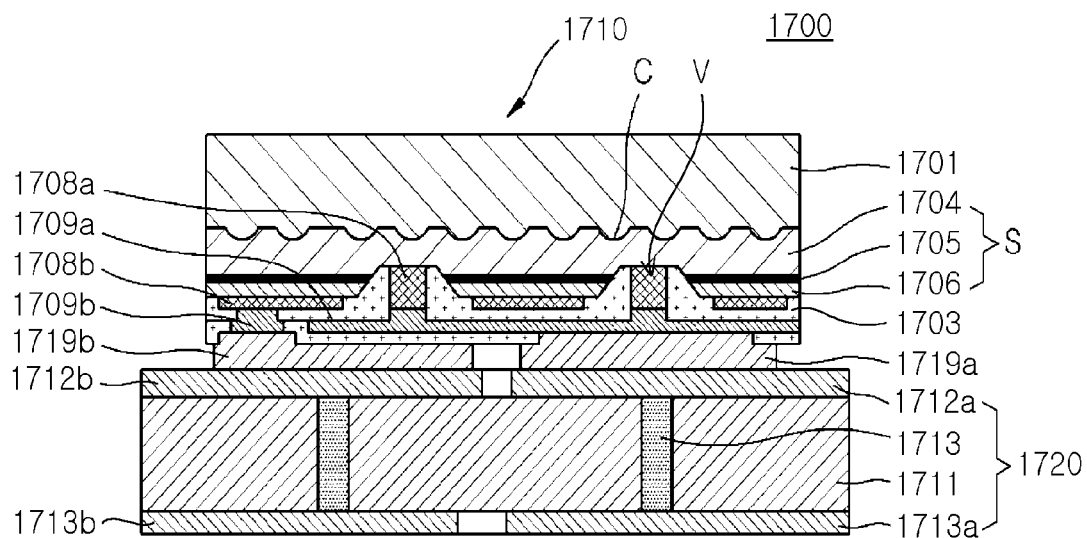

In FIG. 7, a semiconductor light emitting element 1700 having an LED chip 1710 mounted on a mounting substrate 1720 is illustrated as an LED diode 141 that may be employed in the foregoing light source apparatus 100.

The semiconductor light emitting element 1700 illustrated in FIG. 7 includes the LED chip 1710. The LED chip 1710 is presented as an LED chip different from that of the examples described above.

The LED chip 1710 includes a light emitting laminate S disposed on one surface of the substrate 1701 and first and second electrodes 1708a and 1708b disposed on the opposite side of the substrate 1701 based on the light emitting laminate S. Also, the LED chip 1710 includes an insulating layer 1703 covering the first and second electrodes 1708a and 1708b.

The first and second electrodes 1708a and 1708b may be electrically connected with first and second electrode pads 1719a and 1719b connected thereto by electrical connection units 1709a and 1709b.

The light emitting laminate S may include a first conductivity-type semiconductor layer 1704, an active layer 1705, and a second conductivity-type semiconductor layer 1706 sequentially disposed on the substrate 1701. The first electrode 1708a may be provided as a conductive via connected to the first conductivity-type semiconductor layer 1704 through the second conductivity-type semiconductor layer 1706 and the active layer 1705. The second electrode 1708b may be connected to the second conductivity-type semiconductor layer 1706.

The insulating layer 1703 has an open area exposing at least portions of the first and second electrodes 1708a and 1708b, and the first and second electrode pads 1719a and 1719b may be connected to the first and second electrodes 1708a and 1708b.

The first and second electrodes 1708a and 1708b may have a multilayer structure in which one or a plurality of layers made of a conductive material having ohmic characteristics with respect to the first conductivity-type semiconductor layers 1704 and 1706, respectively, are formed. For example, the first and second electrodes 1708a and 1708b may be formed by depositing or sputtering one or more of silver (Ag), aluminum (Al), nickel (Ni), chromium (Cr), a transparent conductive oxide (TCO), and the like. The first and second electrodes 1708a and 1708b may be disposed in the same direction and may be mounted as a so-called flip-chip on a lead frame as described hereinafter. In this case, the first and second electrodes 1708a and 1708b may be disposed to face in the same direction.

In particular, the first electrical connection unit 1709a may be formed by the first electrode 1708a having a conductive via V connected to the first conductivity-type semiconductor layer 1704 by passing through the second conductivity-type semiconductor layer 1704 and the active layer 1705 within the light emitting laminate S.

The amount, a shape, a pitch, a contact area with the first conductivity-type semiconductor layer 1704, and the like, of the conductive via V and the first electrical connection unit 1709a may be appropriately regulated in order to lower contact resistance, and the conductive via V and the first electrical connection unit 1709a may be arranged in a row and in a column to improve current flow.

The amount of conductive vias V and contact areas thereof may be adjusted such that a proportion of the amount of regions of the plurality of conductive vias V formed in rows and columns in contact with the first conductivity-type semiconductor on a plane may range from 1% to 5% of the planar area (i.e., a planar area of the light emitting laminate (S)) of the light emitting device region. A radius (half of a diameter) of the conductive via V may range from 5 µm to 50 µm, and the amount of the conductive vias V may be between one to fifty per light emitting device region, according to a width of respective light emitting device regions. Preferably, two conductive vias V may be provided, which may differ according to a width of the light emitting device region, through. The conductive vias V may have a matrix structure including rows and columns, between which a distance ranges from 100 µm to 500 µm, preferably, ranges from 150 µm to 450 µm. If the distance between respective conductive vias V is below than 100 µm, the amount of conductive vias V is increased and a light emitting area is relatively reduced to decrease luminous efficiency. If the distance between respective conductive vias V is above than 500 µm, current spreading may be problematic, degrading luminous efficiency. A depth of the conductive vias V may range from 0.5 µm to 5.0 µm, but it may differ according to a thickness of the second conductivity-type semiconductor layer 1706 and the active layer 1705.

Another electrode structure may include the second electrode 1708b directly formed on the second conductivity-type semiconductor layer 1706 and the second electrical connection unit 1709b formed on the second electrode 1708b. In addition to having a function of forming electrical-ohmic connection with the second conductivity-type semiconductor layer 1706, the second electrode 1708b may be made of a light reflective material, whereby, as illustrated in FIG. 7, in a state in which the LED chip 1710 is mounted as a so-called flip chip structure, light emitted from the active layer 1705 can be effectively emitted in a direction of the substrate 1701. Of course, the second electrode 1708b may be made of a light-transmissive conductive material such as a transparent conductive oxide, according to a main light emitting direction. As for the first and second electrodes 1708a and 1708b, an ohmic-electrode is laminated as a silver (Ag) layer on the second electrode 1708b on the basis of the second conductivity-type semiconductor layer 1706. The silver (Ag) ohmic-electrode may also serve as a light reflective layer. A single layer made of nickel (Ni), titanium (Ti), platinum (Pt), or tungsten (W), or an alloy thereof, may be alternately selectively laminated on the silver (Ag) layer. In detail, an Ni/Ti layer, a TiW/Pt layer, or a Ti/W layer may be laminated on the Ag layer, or these layers may be alternately laminated on the Ag layer.

As for the first electrode 1708a, a chromium (Cr) layer is laminated on the basis of the first conductivity-type semiconductor layer 1704, and an Au/Pt/Ti layers may be sequentially laminated on the Cr layer, or an Al layer may be laminated on the basis of the first conductivity-type semiconductor layer 1704, and Ti/Ni/Au layers may be sequentially laminated on the Al layer.

Besides the foregoing embodiment, the first and second electrodes 1708a and 1708b may employ various materials or lamination structures in order to have enhanced ohmic characteristics and reflectivity characteristics.

The two electrode structures as described above may be electrically separated by the insulating layer 1703. The insulating layer 1703 may be made of any material as long as it has electrically insulating properties. Namely, the insulating layer 1703 may be made of any material having electrically insulating properties, and here, preferably, a material having a low degree of light absorption is used. For example, a silicon oxide or a silicon nitride such as $SiO_2$, $SiO_xN_y$, $Si_xN_y$, or the like, may be used. If necessary, a light reflective filler may be dispersed in the light-transmissive material to form a light reflective structure.

The first and second electrode pads 1719a and 1719b may be connected to the first and second electrical connection units 1709a and 1709b to serve as external terminals of the LED chip 1710, respectively. For example, the first and second electrode pads 1719a and 1719b may be made of gold (Au), silver (Ag), aluminum (Al), titanium (Ti), tungsten (W), copper (Cu), tin (Sn), nickel (Ni), platinum (Pt), chromium (Cr), NiSn, TiW, AuSn, or a eutectic metal thereof. In this case, when the LED chip 1710 is mounted on the mounting substrate 1720, the first and second electrode pads 1719a and 1719b may be bonded by using the eutectic metal, so solder bumps generally required for flip chip bonding may not be used. The use of a eutectic metal advantageously obtains superior heat dissipation effects in the mounting method to the case of using solder bumps. In this case, in order to obtain excellent heat dissipation effects, the first and second electrode pads 1719a and 1719b may be formed to occupy a relatively large area.

The substrate 1701 and the light emitting laminate S may be understood with reference to content described above with reference to FIG. 4 unless otherwise described. Also, although not shown, a buffer layer may be formed between the light emitting laminate S and the substrate 1701. The buffer layer may be employed as an undoped semiconductor layer made of a nitride, or the like, to alleviate lattice defects of the light emitting laminate S grown thereon.

The substrate 1701 may have first and second main surfaces opposing one another, and an uneven structure C (i.e., depressions and protrusions) may be formed on at least one of the first and second main surfaces. The uneven structure C formed on one surface of the substrate 1701 may be formed by etching a portion of the substrate 1701 so as to be made of the same material as that of the substrate. Alternatively, the uneven structure C may be made of a heterogeneous material different from that of the substrate 1701.

In the exemplary embodiment, since the uneven structure C is formed on the interface between the substrate 1701 and the first conductivity-type semiconductor layer 1704, paths of light emitted from the active layer 1705 can be of diversity, and thus, a light absorption ratio of light absorbed within the semiconductor layer can be reduced and a light scattering ratio can be increased, increasing light extraction efficiency.

In detail, the uneven structure C may be formed to have a regular or irregular shape. The heterogeneous material used to form the uneven structure C may be a transparent conductor, a transparent insulator, or a material having excellent reflectivity. Here, as the transparent insulator, a material such as $SiO_2$, $SiN_x$, $Al_2O_3$, HfO, $TiO_2$, or ZrO may be used. As the transparent conductor, a transparent conductive oxide (TCO) such as ZnO, an indium oxide containing an additive (e.g., Mg, Ag, Zn, Sc, Hf, Zr, Te, Se, Ta, W, Nb, Cu, Si, Ni, Co, Mo, Cr, Sn), or the like, may be used. As the reflective material, silver (Ag), aluminum (Al), or a distributed Bragg reflector (DBR) including multiple layers having different refractive indices, may be used. However, the exemplary embodiment is not limited thereto.

The substrate 1701 may be removed from the first conductivity-type semiconductor layer 1704. To remove the substrate 1701, a laser lift-off (LLO) process using a laser, an etching or a polishing process may be used. Also, after the substrate 1701 is removed, depressions and protrusions may be formed on the surface of the first conductivity-type semiconductor layer 1704.

As illustrated in FIG. 7, the LED chip 1710 is mounted on the mounting substrate 1720. The mounting substrate 1720 includes a first upper electrode layer 1712a, a first lower electrode layer 1712b, a second upper electrode layer 1713a and a second lower electrode layer 1713b formed on upper and lower surfaces of the substrate body 1711, and vias 1713 penetrating the substrate body 1711 to connect the upper and lower electrode layers. The substrate body 1711 may be made of a resin, a ceramic, or a metal, and the upper and lower electrode layers 1712a, 1713a, 1712b and 1713b may be a metal layer made of gold (Au), copper (Cu), silver (Ag), or aluminum (Al).

Of course, the substrate on which the foregoing LED chip 1710 is mounted is not limited to the configuration of the mounting substrate 1720 illustrated in FIG. 7, and any substrate having a wiring structure for driving the LED chip 1710 may be employed. For example, it may also be provided to have a package structure in which an LED chip 1710 is mounted on a package body having a pair of lead frames.

Meanwhile, as the LED 141 according to the present embodiment, LED chips having various structures other than that of the foregoing LED chip described above with reference to FIGS. 4 through 7 may also be used. For example, an LED chip in which surface-plasmon polaritons (SPP) are formed in a metal-dielectric boundary of an LED chip to interact with quantum well excitons, thus obtaining significantly improved light extraction efficiency, may also be advantageously used.

Various types of LED chips may be mounted on a circuit board and used in the foregoing light source apparatus 100, and differently, various types of package structures in which an LED chip is mounted in a package body having a pair of electrode structures may also be used.

A package including an LED chip (hereinafter, referred to as an 'LED package') may provide an external terminal structure facilitating a connection to an external circuit and may have various optical structures having a heat dissipation structure improving heat dissipation characteristics of the LED chip and enhancing light characteristics. For example, the various optical structures may include a lens structure for improving light distribution characteristics or a wavelength conversion unit for converting light emitted from the LED chip into light having a different wavelength.

As an example of an LED package, an LED chip package having a chip scale package (CSP) structure may be used as the LED 141.

The CSP structure, reducing a size of the LED chip package and simplifying a manufacturing process, is appropriate for mass-production, and since a wavelength conversion material such as a phosphor and an optical structure such as a lens can be integrally fabricated together with an LED chip by the CSP, the CSP can be appropriately used in a light source apparatus.

Figure 8:
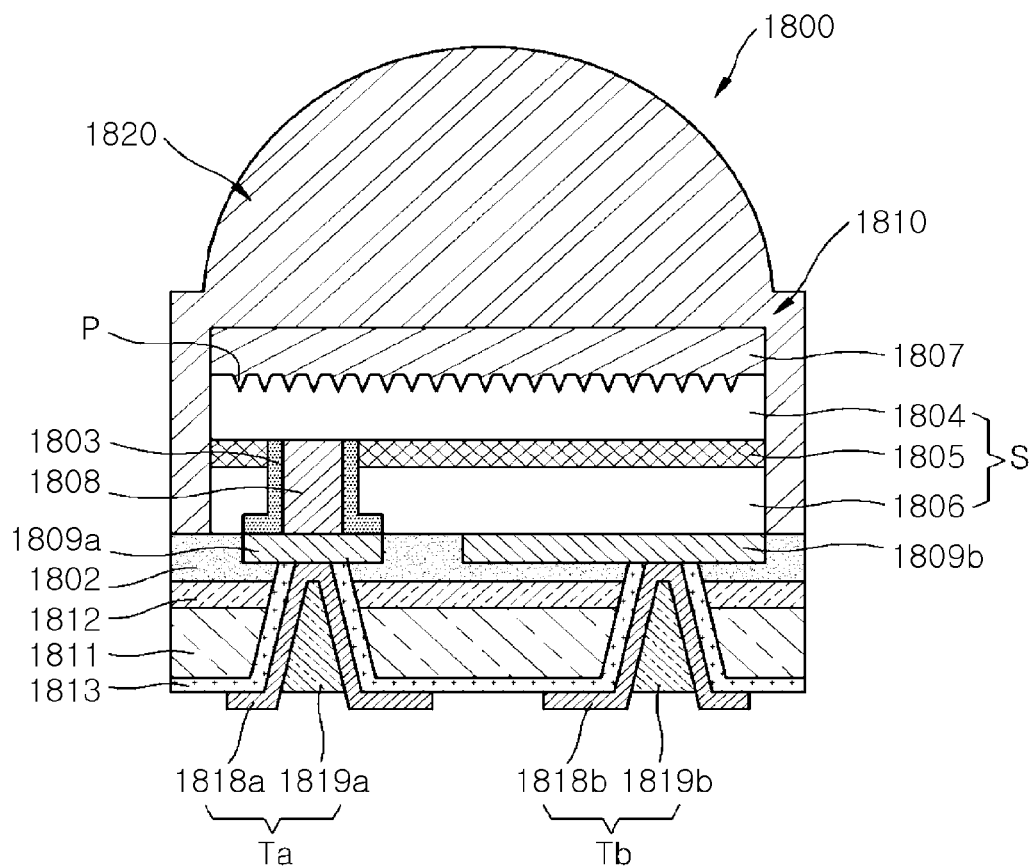

FIG. 8 illustrates an example of a CSP, a package structure in which an electrode is formed on a lower surface of an LED chip 1810, opposite to a main light extracting surface, and a phosphor layer 1807 and a lens 1820 are integrally formed.

The SCP 1800 illustrated in FIG. 8 includes a light emitting laminate S disposed on a mounting substrate 1811, first and second terminal units Ta and Tb, the phosphor layer 1807, and the lens 1820.

The light emitting laminate S is a lamination structure including first and second conductivity-type semiconductor layers 1804 and 1806 and an active layer 1805 disposed therebetween. In the present embodiment, the first and second conductivity-type semiconductor layers 1804 and 1806 may be a n-type and an p-type semiconductor layers, respectively, and may be made of a nitride semiconductor, e.g., $Al_xIn_yGa_{(1-x-y)}N$ ($0 \leq x \leq 1$, $0 \leq y \leq 1$, $0 \leq x+y \leq 1$). However, besides a nitride semiconductor, a GaAs-based semiconductor or GaP-based semiconductor may also be used.

The active layer 1805 formed between the first and second conductivity-type semiconductor layers 1804 and 1806 may emit light having a predetermined level of energy according to electron-hole recombination, and may have a multi-quantum well (MQW) structure in which a quantum well layer and a quantum barrier layer are alternately laminated. In the case of the MQW structure, for example, an InGaN/GaN or AlGaN/GaN structure may be used.

Meanwhile, the first and second conductivity-type semiconductor layers 1804 and 1806 and the active layer 1805 may be formed by using a semiconductor growth process such as metal-organic chemical vapor deposition (MOCVD), molecular beam epitaxy (MBE), hydride vapor phase epitaxy (HVPE), or the like.

The LED chip 1810 illustrated in FIG. 8 is in a state in which a growth substrate was removed, and depressions and protrusions (or an uneven surface) P may be formed on the surface from which the growth substrate was removed. Also, the phosphor layer 1807 may be applied to the uneven surface, as a light conversion layer.

The LED chip 1810 includes first and second electrodes 1809a and 1809b connected to the first and second conductivity-type semiconductor layers 1804 and 1806, respectively. The first electrode 1809a may have a conductive via 1808 connected to the first conductivity-type semiconductor layer 1804 through the second conductivity-type semiconductor layer 1806 and the active layer 1805. An insulating layer 1803 is formed between the active layer 1805 and the second conductivity-type semiconductor layer 1806 in the conductive via 1808 to prevent a short-circuit occurring.

A single conductive via 1808 is illustrated, but two or more conductive vias 1808 may be provided to advantageously distribute current, and may be arranged in various forms.

The mounting substrate 1811 employed in the present embodiment is illustrated as a support substrate such as a silicon substrate to which a semiconductor process can be easily applicable, but the present application is not limited thereto. The mounting substrate 1811 and the LED chip 1810 may be bonded by first and second bonding layers 1802 and 1812. The first and second bonding layers 1802 and 1812 may be made of an electrically insulating material or an electrically conductive material. For example, the electrically insulating material may include an oxide such as $SiO_2$, SiN, or the like, a resin material such as a silicon resin, an epoxy resin, or the like. The electrically conductive material may include silver (Ag), aluminum (Al), titanium (Ti), tungsten (W), copper (Cu), tin (Sn), nickel (Ni), platinum (Pt), chromium (Cr), NiSn, TiW, AuSn, or a eutectic metal alloy thereof. This process may be implemented such that the first and second bonding layers 1802 and 1812 are applied to respective bonding surfaces of the LED chip 1810 and the mounting substrate 1811 and subsequently bonded thereto.

A via is formed from a lower surface of the mounting substrate 1811 so as to be connected to the first and second electrodes 1809a and 1809b of the LED chip 1810 as bonded. An insulator 1813 may be formed on a lateral surface of the via and on a lower surface of the mounting substrate 1811. In a case in which the mounting substrate 1811 is a silicon substrate, the insulator 1813 may be provided as a silicon oxide film through thermal oxidation. The vias are filled with a conductive material to form first and second terminal units Ta and Tb connected to the first and second electrodes 1809a and 1809b. The first and second terminal units Ta and Tb may include seed layers 1818a and 1818b and plating charged units 1819a and 1819b formed through a plating process by using the seed layers 1818a and 1818b.

Meanwhile, as described above, the LED 141 may be disposed on a mounting board such as printed circuit boards (PCBs) 40 and 41. The PCBs 40 and 41 may be selectively made of a material having excellent heat dissipation function and light reflectivity. For example, the PCBs 40 and 41 may be FR4-type PCBs and may be made of an organic resin material containing silicon, polyimide, or the like, and any other organic resin materials. The PCBs 40 and 41 may also be made of a ceramic material such as a silicon nitride, AlN, $Al_2O_3$, or the like, or a metal and a metal compound. Also, an MOCVD or a flexible PCB (FPCB) that can be freely deformed (pliable) may also be used.

Hereinafter, various examples of mounting substrates on which the LED 141 is mounted will be described in detail with reference to FIGS. 9 through 18.

Figure 9:
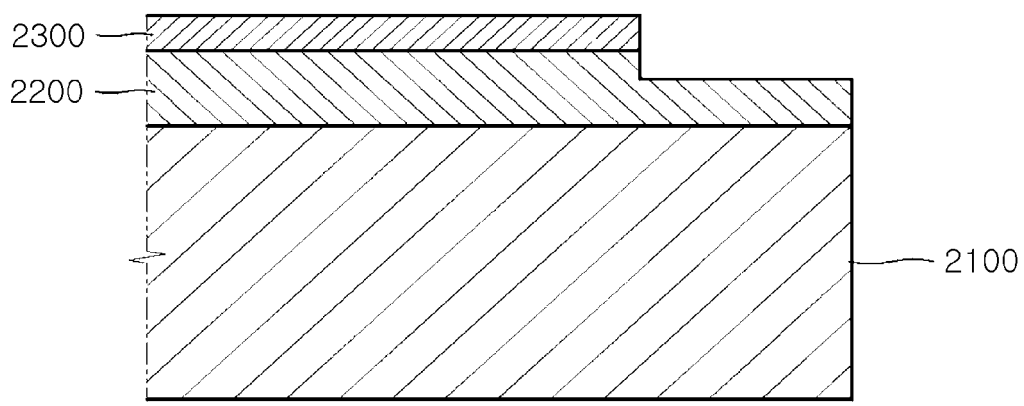
FIGS. 9 through 14 are views illustrating a mounting board on which a light emitting diode (LED) is mounted according to an exemplary embodiment.

Referring to FIG. 9, a mounting substrate includes an insulating layer 2200 formed on a first metal layer 2100 and a second metal layer 2300 formed on the insulating layer 2200. A step region exposing the insulating layer 2200 is formed on an end portion of at least on side of the mounting substrate.

The first metal layer 2100 may be made of a material having excellent heating characteristics. For example, the first metal layer 2100 may be made of a metal such as aluminum (Al), iron (Fe), or the like, or alloys thereof. Here, the first metal layer 2100 may have a unilayer or multilayer structure. The insulating layer 2200 may be basically made of a material having insulating properties, and may be formed by using an inorganic or organic material. For example, the insulating layer 2200 may be made of an epoxy-based insulating resin, and in order to enhance heat conductivity, a metal powder such as an aluminum (Al) powder, or the like, may be included therein so as to be used. The second metal layer 2300 may be generally formed as a copper (Cu) thin film.

Figure 10:
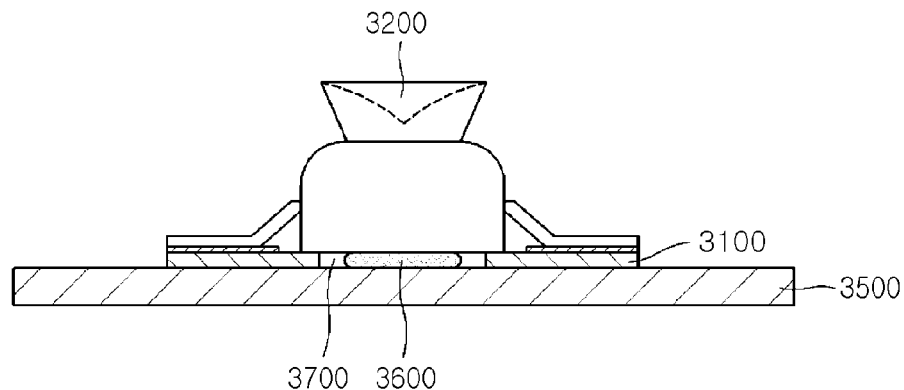

In another example of the mounting substrate on which the LED 141 is mounted, the mounting substrate may be provided as a slim substrate unit as illustrated in FIG. 10. In this case, a thickness and weight of the substrate may be reduced, and manufacturing costs may be reduced. Also, since an LED chip or an LED package employed as an LED is directly coupled to the substrate, heat dissipation efficiency can be increased.

The slim substrate unit may include a circuit board having one or more through holes and an LED (e.g., an LED chip or an LED package) coupled to an upper portion of the circuit board corresponding to the through holes.

In detail, referring to FIG. 10, the slip substrate unit includes an FPCB 3100 on which an LED chip or an LED package 3200 is disposed, and one or more through holes 3700 are formed on the FPCB 3100.

Also, the slim substrate unit may include a support substrate 3500 on which the FPCB 3100 is mounted and a heat dissipation adhesive 3600 provided in the through hole 3700 to combine the bottom of the LED chip or the LED package 3200 and the top of the support substrate 3500. The bottom of the LED package 3200 may be a bottom of an LED chip in which the bottom of the LED chip is directly exposed, or alternatively, may be a bottom of a lead frame of the LED package 3200 or a metal block.

Figure 11:
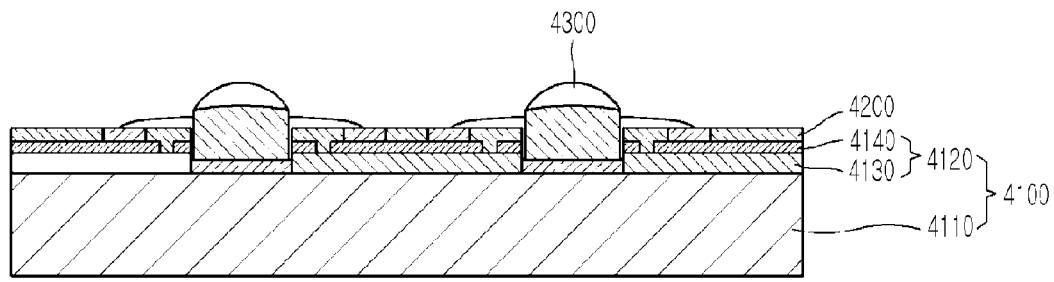

FIG. 11 illustrates another example of the mounting substrate on which the LED 141 is disposed.

Referring to FIG. 11, a PCB 4100 on which the LED 141 is disposed may be formed by laminating an insulating layer 4130 and a resin coated copper (RCC) thin film 4120 made of copper foil laminated on the insulating layer 4130, on the heat dissipation substrate 4110. A protective layer 4200 formed of a photo solder resistor (PSR) is laminated on a circuit layer 4140.

Also, the PCB 4100 may include a metal copper clad laminate (MCCL) having at least one recess on which the LED chip or the LED package 4300 is mounted. In the circuit board, eliminating an insulating layer in a lower region in which a light source of the LED chip or the LED package 4300, a light source is in contact with a heat dissipation substrate to allow heat generated by the light source to be directly transferred to the heat dissipation substrate, enhancing heat dissipation performance.

Figure 12:
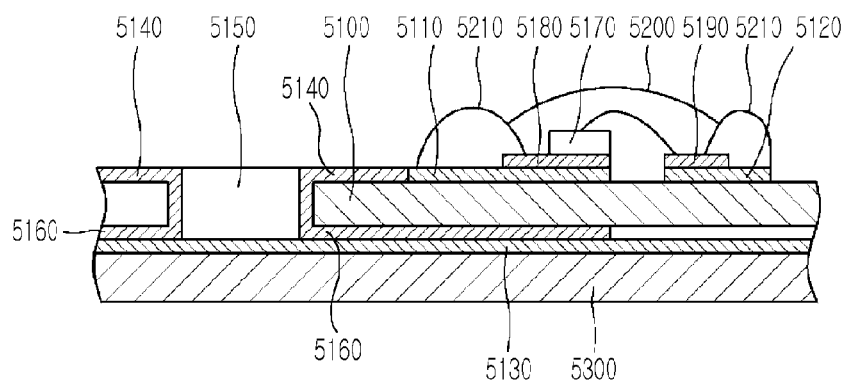

In another example of the mounting substrate, the mounting substrate may include a PCB as illustrated in FIG. 12.

As illustrated in FIG. 12, a circuit board 5100 is an insulating board. Circuit patterns 5110 and 5120 are formed as foils on an upper surface of the circuit board 5100, and an insulating material is coated on a lower surface of the circuit board 5100 to form an insulating thin film 5130. Here, one of various methods such as sputtering, spraying, and the like, may be used as a coating method.

Upper and lower heat diffusion plates 5140 and 5160 are formed on upper and lower surfaces of the circuit board 5100 in order to dissipate heat generated by the LED package. In particular, the upper heat diffusion plate 5140 may be in direct contact with a circuit pattern 5110. For example, an insulating material used to form the insulating thin film 5130 has very low heat conductivity, relative to a thermal pad, but in this case, the insulating thin film 5130 is formed to be very thin to implement a low level of heat resistance, relative to the thermal pad. Heat generated by the LED chip 5170 is transferred to the lower heat diffusion plate 5160 through the upper heat diffusion plate 5140 and emitted to a chassis 5300.

In the mounting substrate according to the present embodiment, two through holes 5150 may be formed in the circuit board 5100, the upper and lower heat diffusion plates 5140 and 5160 such that they are perpendicular to the circuit board 5100. The LED package may include an LED chip 5170, LED electrodes 5180 and 5190, a plastic molding case 5120, a lens 5200, and the like.

A circuit pattern may be formed on the circuit board 5100 as an insulating substrate by coating copper foil on a ceramic or epoxy resin-based FR4-core and performing an etching process thereon.

In the LED package, one or more of an LED chip emitting red light, an LED chip emitting green light, and an LED chip emitting blue light may be mounted, and at least one type of phosphor material may be coated on an upper surface of the blue LED chip.

The phosphor material may be applied in a state in which powder in the form of particles is mixed in a resin, and a ceramic plate layer formed by firing phosphor powder may be positioned on the upper surface of the LED chip. The powder phosphor material may have a size ranging from 1 µm to 50 µm, preferably, ranging from 5 µm to 20 µm, and in case of a nano-phosphor, the nano-phosphor may be a quantum dot having a size ranging from 1 nm to 500 nm, preferably, ranging from 10 nm to 50 nm.

Figure 13:
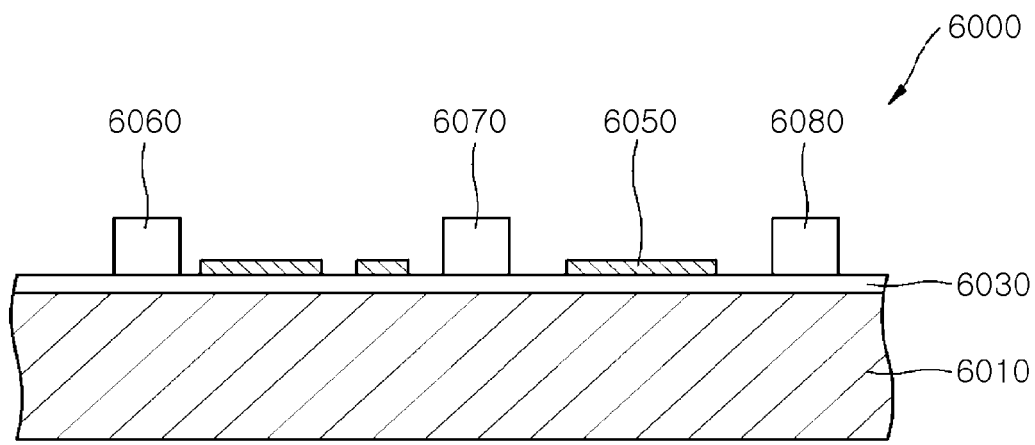

In another example of the mounting substrate, the substrate may include a metal substrate as illustrated in FIG. 13.

As illustrated in FIG. 13, a metal substrate 6000 includes a metal plate 6010 made of aluminum or an aluminum alloy and an aluminum anodized film 6030 formed on an upper surface of the metal plate 6010. Heat generating elements 6060, 6070 and 6080 such as an LED chip, or the like, as a type of an LED, may be mounted on the metal plate 6010. The anodized film 6030 may serve to insulate a wiring 6050 and the metal plate 6010 from one another.

The metal substrate 6000 may be made of aluminum or an aluminum alloy that can be easily obtained at relatively low cost. Besides, the metal substrate 6000 may be made of other anodizable metals. For example, the metal substrate 6000 may be made of titanium, magnesium, or the like. Meanwhile, the aluminum anodized film ($Al_2O_3$) obtained by anodizing aluminum has relatively high heat transmission characteristics equal to approximately 10 to 30 W/mK, so the anodized metal substrate may exhibit superior heat dissipation characteristics to that of a PCB or a metal-core printed circuit board (MCPCB) of a related art polymer substrate.

Figure 14:
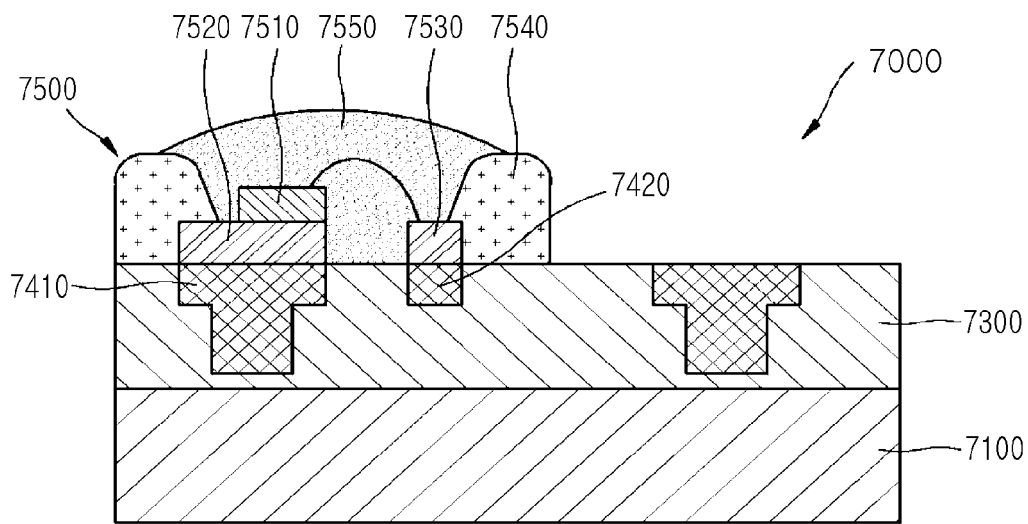

FIG. 14 illustrates a different type of circuit board as another example of the mounting substrate on which the LED 141 according to the present embodiment is mounted.

As illustrated in FIG. 14, a circuit board 7000 includes an insulating resin 7300 coated on a metal substrate 7100, circuit patterns 7410 and 7420 formed on the insulating resin 7300, and a light emitting module 7500 mounted to be electrically connected to the circuit patterns 7410 and 7420. Here, the insulating resin 7300 may have a thickness equal to or less than 200 µm and may be laminated as a solid film on a metal substrate or may be applied as a liquid to a chassis according to a spin coating method or a casting method using a blade. Also, the circuit patterns 7410 and 7420 may be formed by filling a motif of a circuit pattern engraved in the insulating resin 7300 with a metal such as copper.

Referring to FIG. 14, the light emitting module 7500 may include an LED chip 7510 employed as an LED, LED electrodes 7520 and 7530, a plastic molding case 7540, and a lens 7550.

In the present embodiment, the light emitting module 7500 is illustrated as a single package product including the LED chip 7510 therein, but the present embodiment is not limited thereto.

For example, the light emitting module may be an LED itself. Namely, the LED chip may be a Chip On Board (COB) type chip and may be mounted on the metal substrate 7100 and directly electrically connected to the metal substrate 7100 through a flip chip bonding method or a wire bonding method.

A plurality of light emitting modules 7500 may be arranged on the metal substrate 7100. In this case, the light emitting modules 7500 may be homogeneous generating light beams having the same wavelength, or the light emitting modules 7500 may be heterogeneous generating light beams having different wavelengths. Namely, the light emitting modules 7500 may be variously configured.

For example, the light emitting module 7500 may be configured to include at least one of a light emitting element emitting white light by combining green, red, and orange phosphors to a blue LED chip and a purple, blue, green, red, and infrared light emitting element. In this case, the light source apparatus may have a color rendering index (CRI) adjusted to range from natrium (Na) lamp to a sunlight level, or the like, and have a color temperature ranging from candlelight (2000K) to a blue sky (20000K) level to generate various white light beams. If necessary, the light source apparatus may generate visible light having purple, blue, green, red, orange colors, or infrared light to adjust an illumination color according to a surrounding atmosphere or mood. Also, the light source apparatus may generate light having a special wavelength stimulating plant growth.

Figure 15:
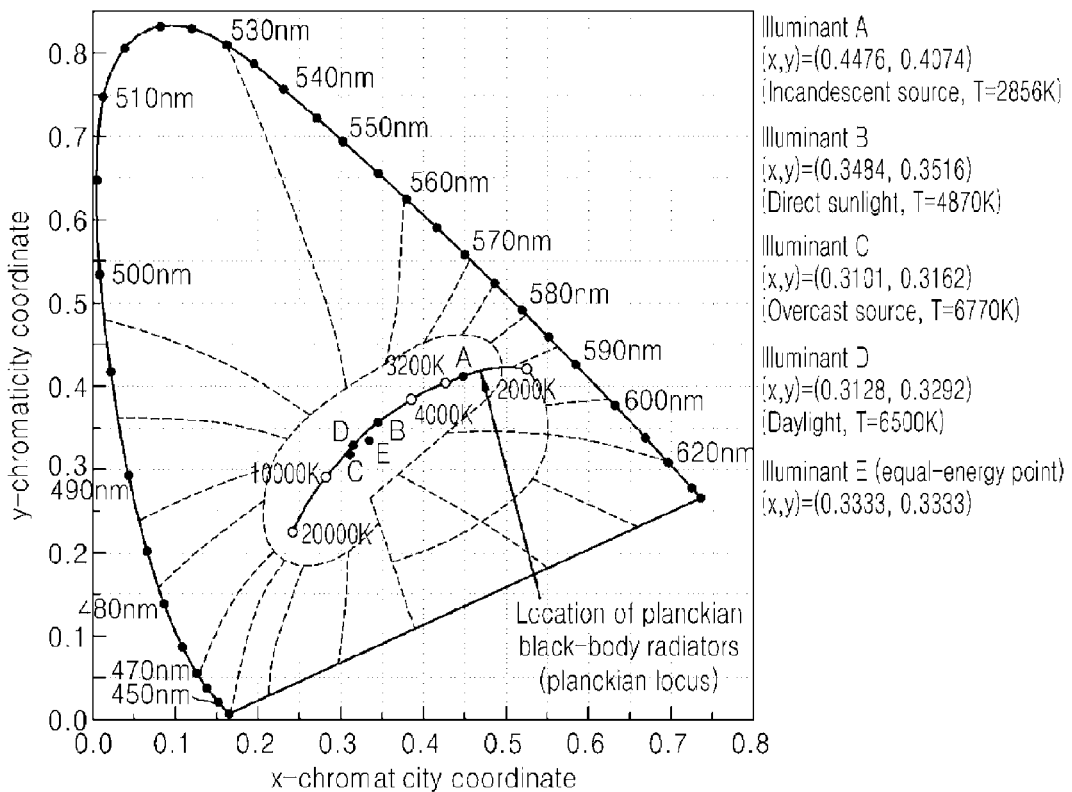
FIG. 15 is a CIE 1931 chromaticity diagram illustrating a Planckian spectrum.

White light generated by combining yellow, green, red phosphors and/or green and red LED chips and a red LED chip may have two or more peak wavelengths and may be positioned in a segment linking (x, y) coordinates (0.4476, 0.4074), (0.3484, 0.3516), (0.3101, 0.3162), (0.3128, 0.3292), (0.3333, 0.3333) of a CIE 1931 chromaticity diagram. Alternatively, white light may be positioned in a region surrounded by a spectrum of black body radiation and the segment. A color temperature of white light corresponds to a range from 2,000K to 20,000K. FIG. 15 illustrates the Planckian spectrum.

For example, phosphors used in a light emitting module may have the following empirical formula and colors.

Oxide system: Yellow and green $(Y, Lu, Se, La, Gd, Sm)_3(Ga, Al)_5O_{12}$:Ce, blue $BaMgAl_{10}O_{17}$:Eu, $3Sr_3(PO_4)_2$/CaCl:Eu Silicate system: Yellow and green $(Ba, Sr)_2SiO_4$:Eu, yellow and orange $(Ba, Sr)_3SiO_5$:Eu Nitride system: Green β-SiAlON:Eu, Yellow $(La, Gd, Lu, Y, Sc)_3Si_6N_{11}$:Ce, Orange α-SiAlON:Eu, Red $(Sr, Ca)AlSiN_3$:Eu, $(Sr, Ca)AlSi(ON)_3$:Eu, $(Sr, Ca)_2Si_5N_8$:Eu, $(Sr, Ca)_2Si_5(ON)_8$:Eu, $(Sr, Ba)SiAl_4N_7$:Eu Sulfide system: Red $(Sr, Ca)S$:Eu, $(Y, Gd)_2O_2S$:Eu, Green $SrGa_2S_4$:Eu Phosphor compositions should be basically conformed with Stoichiometry, and respective elements may be substituted with different elements of respective groups of the periodic table. For example, strontium (Sr) may be substituted with barium (Ba), calcium (Ca), magnesium (Mg), or the like, of alkali earths, and yttrium (Y) may be substituted with terbium (Tb), Lutetium (Lu), scandium (Sc), gadolinium (Gd), or the like. Also, europium (Eu), an activator, may be substituted with cerium (Ce), terbium (Tb), praseodymium (Pr), erbium (Er), ytterbium (Yb), or the like, according to a desired energy level, and an activator may be applied alone or a coactivator, or the like, may be additionally applied to change characteristics.

Also, materials such as quantum dots, or the like, may be applied as materials that replace phosphors, and phosphors and quantum dots may be used in combination or alone in an LED.

Figure 16:
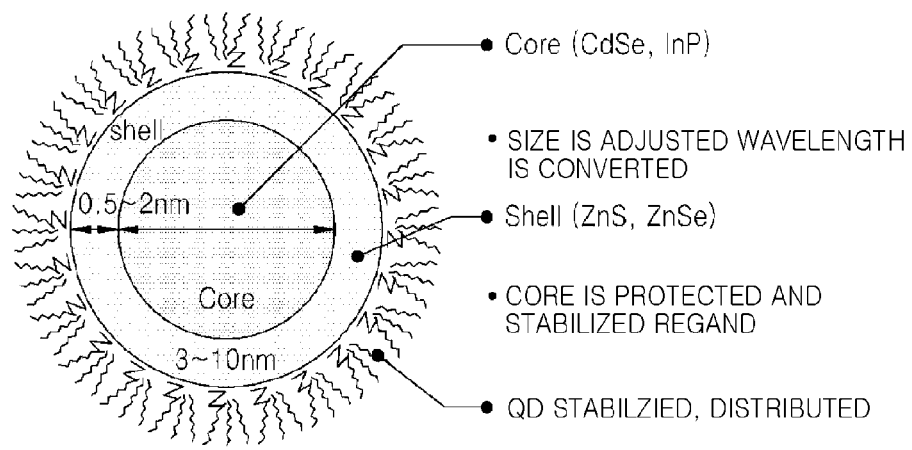
FIG. 16 illustrates a structure of a quantum dot.

A quantum dot may have a structure including a core (3 to 10 nm) such as CdSe, InP, or the like, a shell (0.5 to 2 nm) such as ZnS, ZnSe, or the like, and a ligand for stabilizing the core and the shell, and may implement various colors according to sizes. FIG. 16 illustrates the structure of a quantum dot as described above.

FIG. 17 is a view illustrating types of phosphors for application fields of white light emitting devices using a blue LED chip (440 to 460 nm).

Phosphors or quantum dots may be applied by using at least one of a method of spraying them on an LED chip or a light emitting module, a method of covering as a film, and a method of attaching as a sheet of ceramic phosphor, or the like.

As the spraying method, dispensing, spray coating, or the like, is generally used, and dispensing includes a pneumatic method and a mechanical method such as screw, linear type, or the like. Through a jetting method, an amount of dotting may be controlled through a very small amount of discharging and color coordinates (or chromaticity) may be controlled therethrough. In case of a method of collectively applying phosphors on a wafer level or on a mounting board on which an LED is mounted, productivity can be enhanced and a thickness can be easily controlled.

The method of covering phosphors or quantum dots as a film on an LED module or an LED chip may include electrophoresis, screen printing, or a phosphor molding method, and these method may have a difference according to whether a lateral surface of a chip is required to be coated or not.

Meanwhile, in order to control efficiency of a long wavelength light emitting phosphor re-absorbing light emitted in a short wavelength, among two types of phosphors having different light emitting wavelengths, two types of phosphor layers having different light emitting wavelengths may be provided, and in order to minimize re-absorption and interference of chips and two or more wavelengths, a distributed Bragg reflector (DBR) or omni-directional reflector (ODR) layer may be included between respective layers.

In order to form a uniform coated film, after a phosphor is fabricated as a film or a ceramic form and attached to a chip or a light emitting device.

In order to differentiate light efficiency and light distribution characteristics, a light conversion material may be positioned in a remote form, and in this case, the light conversion material may be positioned together with a material such as a light-transmissive polymer, glass, or the like, according to durability and heat resistance.

A phosphor applying technique plays the most important role in determining light characteristics in an LED device, so techniques of controlling a thickness of a phosphor application layer, a uniform phosphor distribution, and the like, have been variously researched. A quantum dot may also be positioned in an LED chip or a light emitting device in the same manner as that of a phosphor, and may be positioned in glass or light-transmissive polymer material to perform optical conversion.

Meanwhile, in order to protect an LED chip or a light emitting module from an external environment or in order to improve light extraction efficiency of light emitted to the outside of a light emitting device, a light-transmissive material may be positioned as a filler on the LED chip or the light emitting module.

In this case, a transparent organic solvent such as epoxy, silicon, a hybrid of epoxy and silicon, or the like, is applied as a light-transmissive material, and the light-transmissive material may be cured according to heating, light irradiation, a time-lapse method, or the like.

In case of silicon, polydimethyl siloxane is classified as a methyl-based silicon and polymethylphenyl siloxane is classified as a phenyl-based silicon. The methyl-based silicon and the phenyl-based silicon have differences in refractive indexes, water vapor transmission rates, light transmittance amounts, light fastness qualities, and thermostability. Also, the methyl-based silicon and the phenyl-based silicon have differences in curing speeds according to a cross linker and a catalyst, affecting phosphor distribution.

Light extraction efficiency varies according to a refractive index of a filler, and in order to minimize a gap between a refractive index of the outermost medium of a chip of a portion from which blue light is emitted and a refractive index of a portion emitted by air, two or more types of silicon having different refractive indices may be sequentially laminated.

In general, the methyl-based silicon has the highest level of thermostability, and variations in a temperature increase are reduced in order of phenyl-based silicon, hybrid silicon, and epoxy silicon. Silicon may be classified as a gel type silicon, an elastomer type silicon, and a resin type silicon according to the degree of hardness thereof.

Also, the light emitting module may further include a lens for radially guiding light emitted from a light source. In this case, a previously formed lens may be attached to an LED chip or the light emitting module according to a lens attachment method, or an organic solvent having fluidity may be injected into an LED chip or may be injected to a mold and solidified according to a mold injection method.

The lens attachment method includes directly attaching a lens to a filler, bonding only an upper portion of a chip or an outer portion of a light emitting device or an outer portion of the lens, spaced apart from the filler, and the like. As the method of injecting into a mold, injection molding, transfer molding, compression molding, or the like, may be used.

Light transmission characteristics may be changed according to shapes of lenses (concave, convex, uneven, conical, and geometrical structures), and lenses may be modified according to efficiency and light distribution characteristics.

In another example of the mounting board on which the LED 141 is disposed, as illustrated in FIG. 18, the mounting board may be a circuit board in which an LED chip is directly mounted on a PCB 8100 or an LED package 8200 including the LED chip is mounted on the PCB 8100 and a waterproof agent 8110 may be applied to surround the ambient area thereof.

Meanwhile, the LED that may be employed in the light source apparatus according to an exemplary embodiment, and the mounting board on which the LED is disposed are not limited to the foregoing examples, and obviously, any LED or mounting board not described above may also be employed in the light source apparatus according to an exemplary embodiment.

Figure 19:
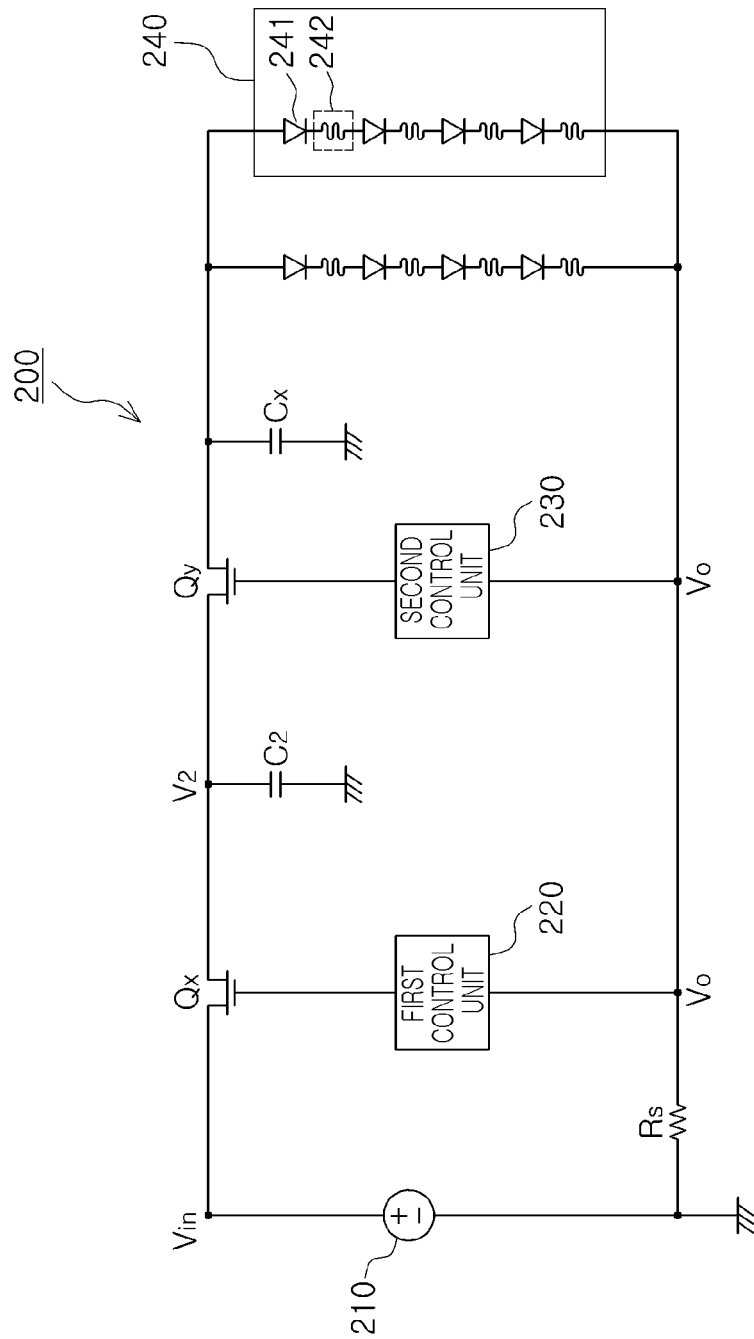
FIG. 19 is a circuit diagram of a light source apparatus according to another exemplary embodiment.

FIG. 19 is a circuit diagram of a light source apparatus 200 according to another exemplary embodiment.

With reference to FIG. 19, the light source apparatus 200 may further include a second switch Qy controlling power applied from the main switch Qx to an LED string 240 according to an on/off switching operation. In this case, the capacitor Cx may have a connection structure so as to be charged with a voltage of power applied to the LED string 240 (including LED 241 and inductance unit 242) from the power source 210 when the main switch Qx and the second switch Qy are switched on and to apply the charged voltage to the LED string 240 when either of the main switch Qx and the second switch Qy is switched off.

Here, the main switch Qx and the second switch Qy may respectively receive first and second switching control signals from first and second control units 220 and 230 to then repeatedly perform an on/off switching operation, and the configuration of the first and second control units 220 and 230 may be the same as the controller described in the afore-described embodiment. For example, the light source apparatus 200 may include a comparator comparing an electrical signal output from the LED string 240, and a reference signal, for example, reference voltages $V_{ref1}$ and $V_{ref2}$ to each other and outputting comparison results therefrom, and a PWM controller providing pulse width-modulated first and second PWM control signals for controlling respective switches to the main switch Qx and the second switch Qy, respectively, according to the comparison results from the comparator. In addition, the first control unit 220 and the second control unit 230 may be implemented as a single controller.

Figure 20A:
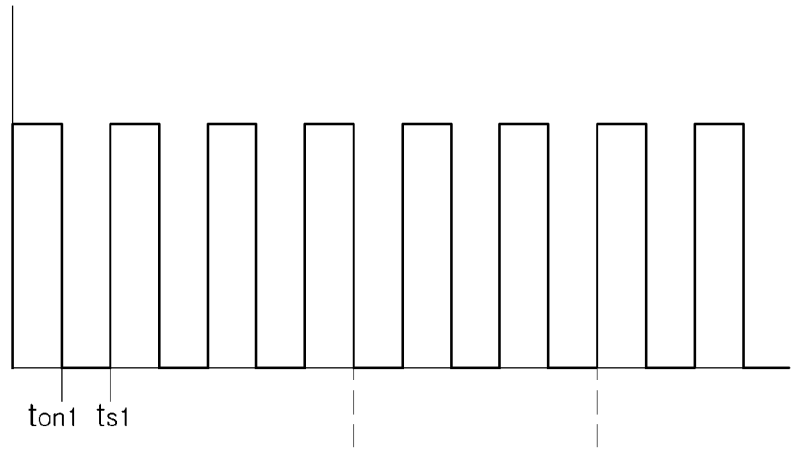
FIGS. 20A to 20C are graphs illustrating output waveforms of first and second switching control signals and a second switch according to the exemplary embodiment of FIG. 19.
Figure 20B:
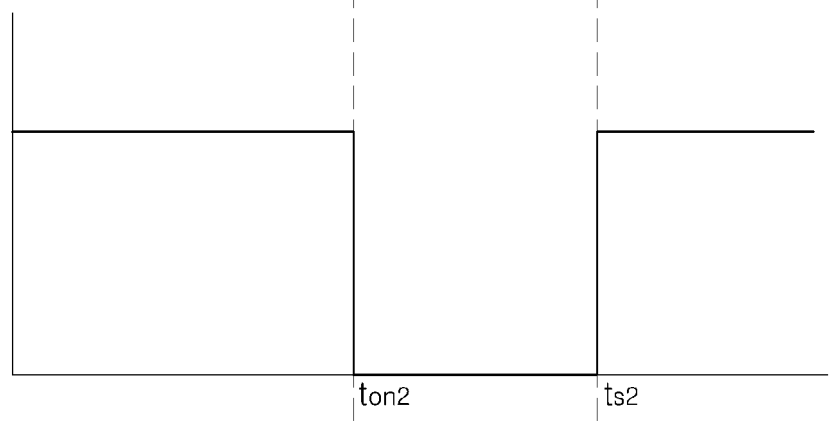
Figure 20C:
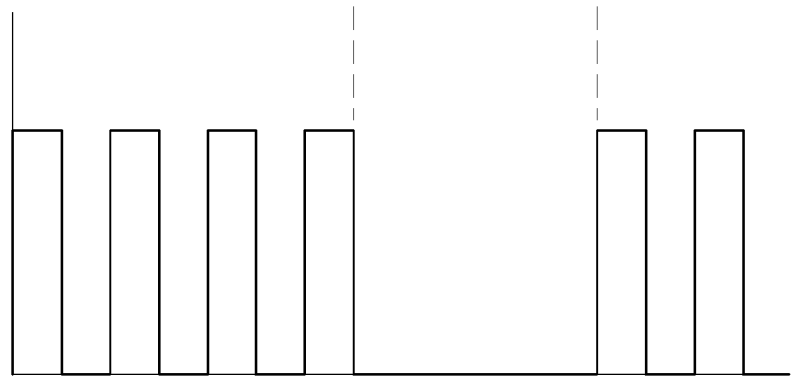

FIGS. 20A and 20B are graphs schematically illustrating first and second switching control signal waveforms according to the exemplary embodiment, and FIG. 20C is a graph schematically illustrating an electrical signal waveform that may be measured in an output terminal of the second switch Qy. According to the exemplary embodiment, the light source apparatus 200 may implement a burst mode scheme through the first and second switches Qx and Qy.

In detail, a signal period $t_{s1}$ of a first PWM control signal as a first switching control signal output by the first control unit 220, and a signal period $t_{s2}$ of a second PWM control signal as a second switching control signal output by the second control unit 230 may satisfy the following conditional equation (1).

In addition, an on time $t_{on1}$ of the first PWM control signal and an on time $t_{on2}$ of the second PWM control signal may satisfy the following conditional equation (2).

$$t_{s1} \leq t_{s2} \qquad \text{Conditional Equation (1)}$$

$$t_{on1} \leq t_{on2} \qquad \text{Conditional Equation (2)}$$

When referring to the graphs of FIGS. 20A to 20C in a state in which the conditions described above are satisfied, a degree of freedom in determination of a duty ratio may be improved and power consumption efficiency may be improved in the setting of an excessive duty ratio or a change therein, as compared to the case in which the power 210 applied to the LED string 240 is controlled by a single switch. However, the waveforms and conditional equations (1) and (2) illustrated in FIGS. 20A to 20C are provided by way of example, and a PWM signal period and a duty ratio of a first switching control signal and a second switching control signal may be appropriately varied according to the necessity.

Enhancement in the power consumption efficiency according to the present embodiment will be described in detail.

Figure 29:
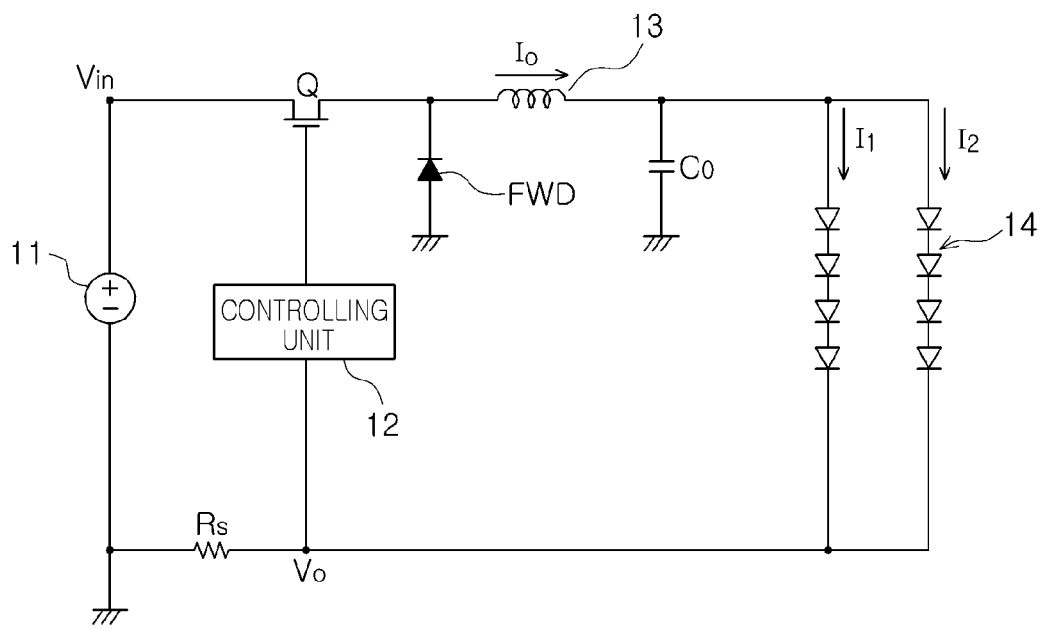
FIG. 29 is a circuit diagram of a conventional direct current to direct current (DC to DC) converter.

FIG. 29 illustrates a light source apparatus including a conventional buck type DC to DC converter and is provided to clearly understand characteristics of the embodiments of the exemplary embodiment, and thus, is not limited thereto.

First, in the case of the light emitting apparatus shown in FIG. 29, maximum potential difference $V_{Qmax}$ and $V_{FWDmax}$ applied to input and output terminals of a switch Q and a free-wheeling diode FWD are respectively equal to an applied voltage $V_{in}$ of the power 11, and average currents $I_{Qavg}$ and $I_{FWDavg}$ flowing in the switch Q and the free-wheeling diode FWD may be respectively $$\frac{I_o^2 R_o}{V_{in}}$$

and $$I_o - \frac{I_o^2 R_o}{V_{in}}.$$

Therefore, conduction power loss $P_{Qpass}$, $P_{FWDpass}$ by the switch Q and the free-wheeling diode FWD may be respectively calculated as $$\left(\frac{I_o^2 R_o}{V_{in}}\right)^2 R_{sw}$$

and $$\left(I_o - \frac{I_o^2 R_o}{V_{in}}\right)^2 R_{sw},$$

and a switching power loss $P_{Qsw}$, $P_{FWDsw}$ of the switch Q and the free-wheeling diode FWD may be respectively calculated as $$\frac{C_{sw} V_{in}^2}{T_s}.$$

($R_o$ indicates an equivalent resistor of a single LED string 240, $R_{sw}$ indicates a resistance of the switch Q, and $C_{sw}$ indicates a capacitance of both terminals of the switch Q)

Meanwhile, according to the present embodiment of FIG. 19, maximum potential differences $V_{Qx\_max}$ and $V_{Qy\_max}$ applied to input and output terminals of the main switch Qx and the second switch Qy may become $V_{in}-V_2$ and $V_2-I_o R_o$. In addition, average current $I_{Qx\_avg}$ and $I_{Qy\_avg}$ flowing in the main switch Qx and the second switch Qy may be respectively calculated as $$\frac{I_o V_2}{V_{in}}$$

and $I_o$, and thus, conduction power losses $P_{Qx\_pass}$, and $P_{Qy\_pass}$ by the main switch Qx and the second switch Qy may be respectively calculated as $$\left(\frac{I_o^2 V_2}{V_{in}}\right)^2 R_{sw}$$

and $I_o^2 R_{sw}$. Further, in this case, the switching power losses $P_{Qx\_sw}$ and $P_{Qy\_sw}$ of the main switch Qx and the second switch Qy may be $$\frac{C_{sw}(V_{in}-V_2)^2}{T_{s1}}$$

and $$\frac{C_{sw}(V_{in}-I_o R_o)^2}{T_{s2}},$$

respectively. It is assumed that the main switch Qx and the second switch Qy may use a single switching device, and a resistance of a switch and a capacitance of both ends of a switch are $R_{sw}$ and $C_{sw}$, respectively, to be equal to each other.

The results described above may be referred to in Table 1 below. According to the present embodiment, it can be appreciated that a maximum voltage applied to both ends of the switch is reduced and a switching loss is improved.

TABLE 1

| | Light Source Apparatus of FIG. 29 | Embodiment of FIG. 19 |
|---|---|---|
| Conduction Power Loss | $P_{Qpass} = \left(\frac{I_o^2 R_o}{V_{in}}\right)^2 R_{sw}$ | $P_{Qx\_pass} = \left(\frac{I_o^2 V_2}{V_{in}}\right)^2 R_{sw}$ |
| | $P_{FWpass} = \left(I_o - \frac{I_o^2 R_o}{V_{in}}\right)^2 R_{sw}$ | $P_{Qy\_pass} = I_o^2 R_{sw}$ |
| Switching Power Loss | $P_{Qsw} = P_{FWDsw} = \frac{C_{sw} V_{in}^2}{T_s}$ | $P_{Qx\_sw} = \frac{C_{sw}(V_{in}-V_2)^2}{T_{s1}}$ |
| | | $P_{Qy\_sw} = \frac{C_{sw}(V_{in}-I_o R_2)^2}{T_{s2}}$ |

In addition, the light source apparatus 200 according to the present embodiment may further include a voltage stabilizer C2 connected in parallel between an output terminal of the main switch Qx and an input terminal of the second switch Qy. The voltage stabilizer C2 may be implemented by a capacitor and may effectively remove noise of power applied to the LED string 240.

Figure 21:
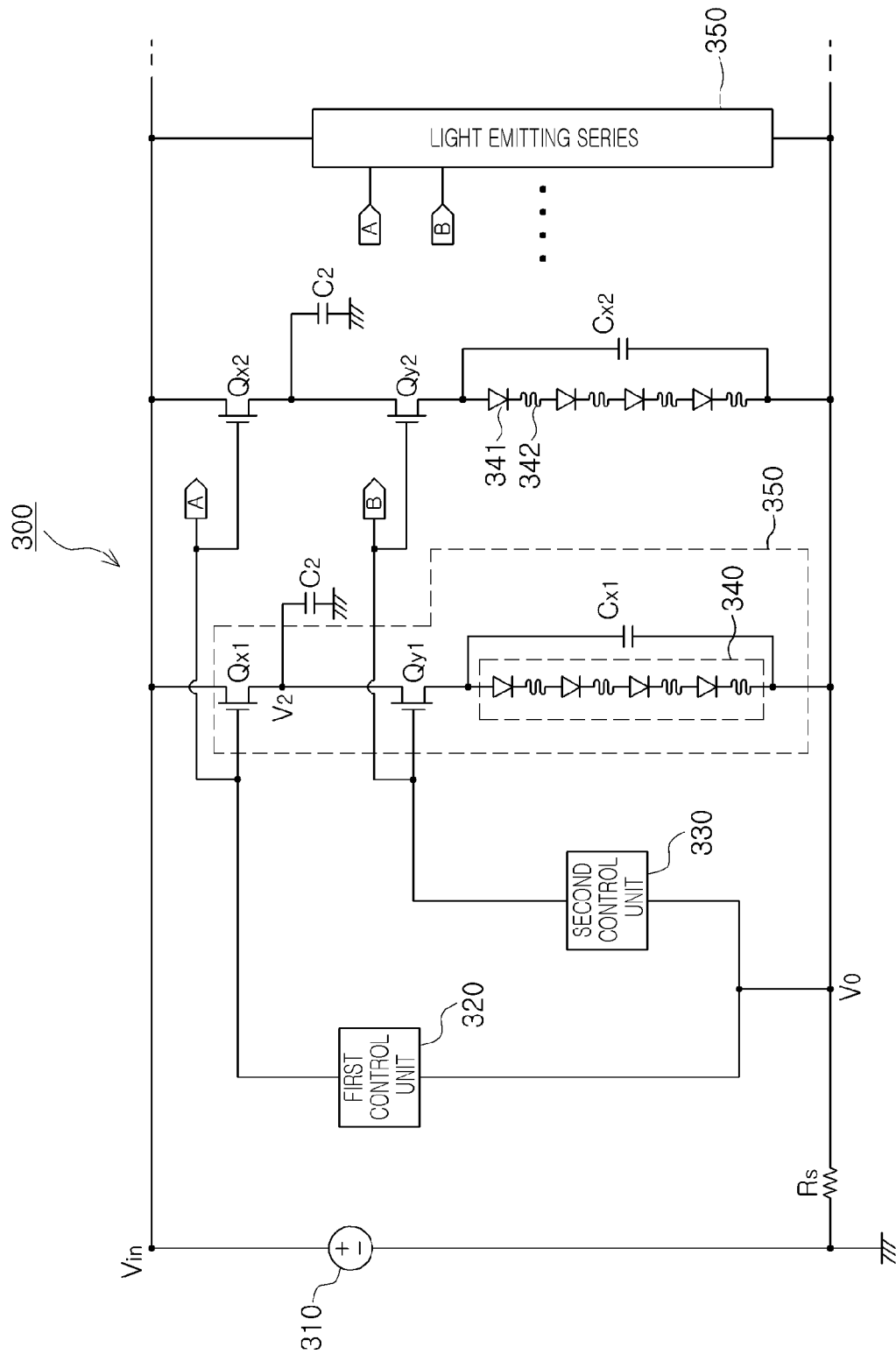
FIGS. 21 to 24 are circuit diagrams of a light source apparatus according to another exemplary embodiment.

FIG. 21 illustrates a light source apparatus 300 according to another exemplary embodiment.

With reference to FIG. 21, the light source apparatus 300 may include at least two light emitting series 350 connected in parallel with each other with respect to power applied thereto. The light emitting series 350 may be defined as a set including an LED string 340, a main switch Qx, a capacitor Cx and a second switch Qy, and the LED string 340 may include at least one light emitting diode 341 and at least one inductance unit 342 generating an induced current according to a change in a current applied to the light emitting diode 341. In the present embodiment, it may be understood that the main switch Qx and the second switch Qy described in the foregoing embodiment are distributed in each LED string 340.

In the present embodiment, the light source apparatus 300 may further include first and second control units 320 and 330 respectively providing first and second switching control signals to the main switch Qx and the second switch Qy. Although the light source apparatus 300 may also include the first and second control units 320 and 330 for each light emitting series 350, the light source apparatus 300 may have a structure in which the control signal is transmitted to the main switches Qx and the second switches Qy of the plurality of light emitting series 350 from a single first control unit 320 and a single second control unit 330, as shown in FIG. 21. Further, the first control unit 320 and the second control unit 330 may be implemented as a single controller.

With reference to the embodiment of FIG. 21, maximum potential differences $V_{Qx\_max}$ and $V_{Qy\_max}$ respectively applied to input and output terminals of the main switch Qx and the second switch Qy may be $V_{in}$-$V_2$ and $V_2$-$I_oR_o$ respectively. In addition, average current $I_{Qx\_avg}$ and $I_{Qy\_avg}$ flowing in the main switch Qx and the second switch Qy may be respectively calculated as $$\frac{I_o V_2}{V_{in} N}$$

and $$\frac{I_0}{N}.$$

Thus, the conduction power losses $P_{Qx\_pass}$ and $P_{Qy\_pass}$ by the main switch Qx and the second switch Qy may be respectively calculated as $$\left(\frac{I_o^2 V_2}{V_{in} N}\right)^2 R_{sw}$$

and $$\left(\frac{I_o}{N}\right)^2 R_{sw},$$

and the total conduction power losses of the main switch Qx and the second switch Qy may be respectively calculated as $$N\left(\frac{I_o^2 V_2}{V_{in} N}\right)^2 R_{sw}$$

and $$N\left(\frac{I_o}{N}\right)^2 R_{sw}.$$

In this case, the switching power losses $P_{Qx\_sw}$ and $P_{Qy\_sw}$ of the main switch Qx and the second switch Qy may be calculated as $$\frac{C_{sw}(V_{in} - V_2)^2}{T_{s1}}$$

and $$\frac{C_{sw}(V_{in} - I_o R_o)^2}{T_{s2}},$$

respectively. Here, it is assumed that the main switch Qx and the second switch Qy may use a single switching device, and a resistance of a switch and a capacitance of both ends of a switch are $R_{sw}$ and $C_{sw}$, respectively, to be equal to each other. $R_o$ refers to one equivalent resistor of the LED string 340.

TABLE 2

| | Light Source Apparatus of FIG. 29 | Embodiment of FIG. 21 |
|---|---|---|
| Conduction Power Loss | $P_{Qpass} = \left(\frac{I_o^2 R_o}{V_{in}}\right)^2 R_{sw}$ | $P_{Qx\_pass} = \left(\frac{I_o^2 V_2}{V_{in} N}\right)^2 R_{sw}$ |
| | $P_{FWpass} = \left(I_o - \frac{I_o^2 R_o}{V_{in}}\right)^2 R_{sw}$ | $P_{Qy\_pass} = \left(\frac{I_o}{N}\right)^2 R_{sw}$ |
| Switching PowerLoss | $P_{Qsw} = P_{FWsw} = \frac{C_{sw} V_{in}^2}{T_s}$ | $P_{Qx\_sw} = \frac{C_{sw}(V_{in} - V_2)^2}{T_{s1}}$ |
| | | $P_{Qy\_sw} = \frac{C_{sw}(V_{in} - I_o R_o)^2}{T_{s2}}$ |

Referring to Table 2 above, it can be appreciated that the conduction power loss is effectively reduced as compared to the light source apparatus described with reference to FIG. 29. In particular, in a case in which the input voltage is relatively low and the number of LED strings connected to one another in parallel are increased to thus require a relatively large Io value, the main switches and the second switches are distributed to be provided for each LED string, thereby reducing a conduction power loss of a device and improving power consumption efficiency. In addition, heat radiation of a driving circuit is reduced so as to reduce the size of a heat radiating plate, and since it is unnecessary to include a separate inductance device, miniaturization of the device may be implemented.

Figure 22:
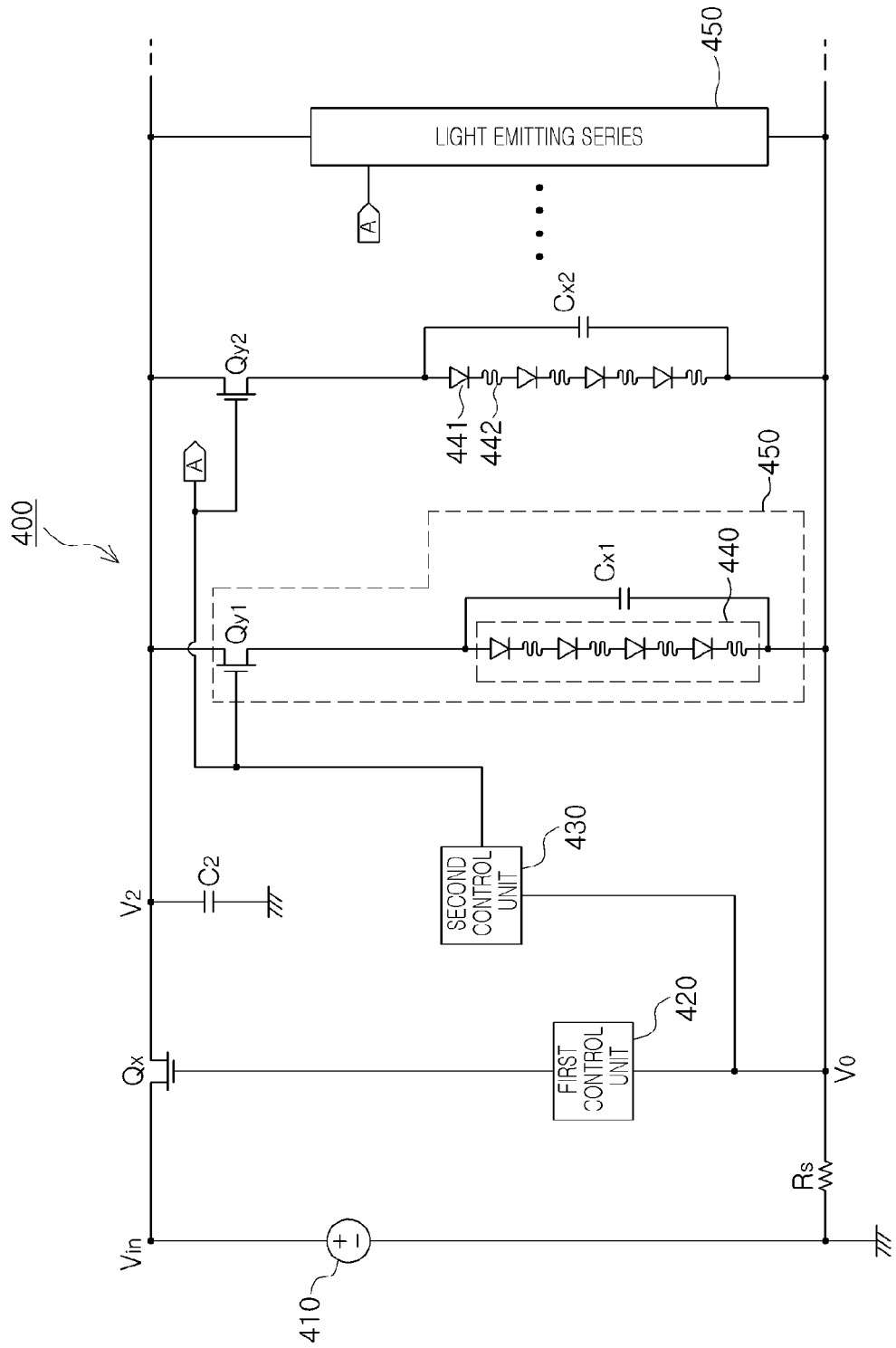

FIG. 22 is a circuit diagram illustrating another example of a light source apparatus 400, varied from the embodiment of FIG. 21.

With reference to FIG. 22, the light source apparatus 400 may include at least two light emitting series 450 connected in parallel with each other. In the present embodiment, the light emitting series 450 may be defined as a set including an LED string 440, a capacitor Cx and a second switch Qy, and this may be understood to have a type in which the main switch Qx is excluded from the light emitting series 340 defined in the embodiment of the FIG. 21. Here, since the main switch Qx does not need to be provided for each light emitting series, the number of devices may be reduced. The light source apparatus 400 may further include power source 410 and first and second control units 420 and 430 respectively providing first and second switching control signals to the main switch Qx and the second switch Qy.

Figure 23:
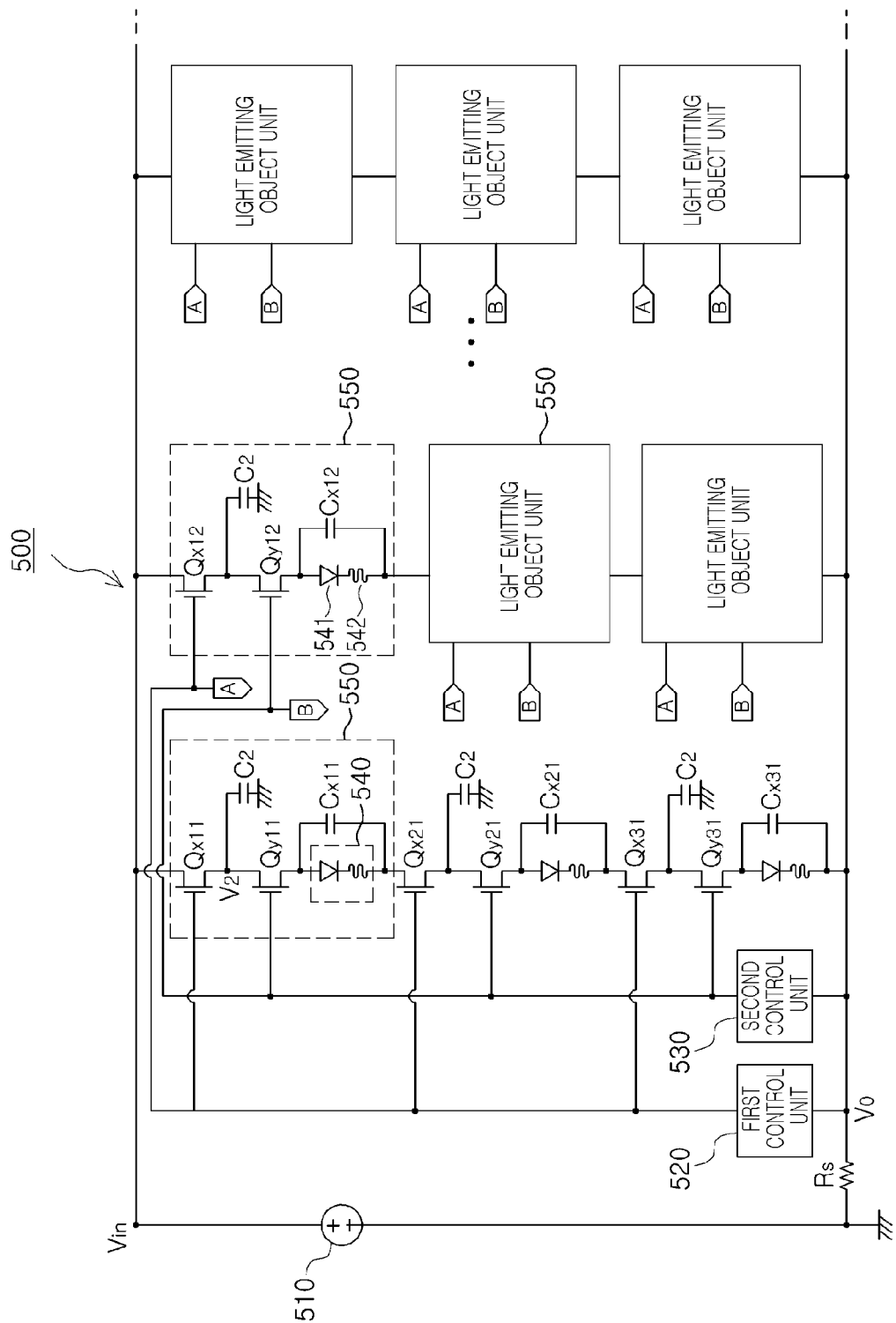

FIG. 23 is a circuit diagram of a light source apparatus 500 according to another exemplary embodiment.

With reference to FIG. 23, the light source apparatus 500 may include a plurality of light emitting objects 550 connected to one another in series and in parallel. The light source apparatus 500 may further include power source 510. The light emitting object 550 may be defined as a set including an LED string 540, a main switch Qx, a capacitor Cx, and a second switch Qy, and here, the LED string 540 may include at least one light emitting diode 541 and at least one inductance unit 542 generating an induced current according to a change in a current applied to the light emitting diode 541.

Here, it may be understood that the main switch Qx and the second switch Qy described in the embodiment of FIG. 19 are distributed as a single light emitting diode (541) unit.

In the present embodiment, the light source apparatus 500 may further first and second control units 520 and 530 respectively providing first and second switching control signals to the main switch Qx and the second switch Qy. Although the light source apparatus 500 may also include the first and second control units 520 and 530 for each light emitting object 550, the light source apparatus 500 may have a structure in which the control signal is transmitted to the main switches Qx and the second switches Qy of the plurality of light emitting objects 550 from a single first control unit 520 and a single second control unit 530, as shown in FIG. 23.

Referring to the present embodiment, $I_o$ may be divided into $I_o/N$, and $V_{in}$ and $V_2$ are respectively divided into $V_{in}/M$ and $V_2/M$, such that power consumption efficiency may be effectively improved. (N indicates a parallel number of the light emitting object 550, and M indicates a serial number of the light emitting object 550).

With reference to the embodiment of FIG. 23, maximum potential differences $V_{Qx\_max}$ and $V_{Qy\_max}$ respectively applied to input and output terminals of the main switch Qx and the second switch Qy may be $$\frac{V_{in} - V_2}{M}$$

and $$\frac{V_2}{M} - I_o R_o,$$

respectively, and average current $I_{Qx\_avg}$ and $I_{Qy\_avg}$ flowing in the main switch Qx and the second switch Qy may be respectively calculated as $$\frac{I_o V_2}{V_{in} N}$$

and $$\frac{I_o}{N}.$$

Thus, the conduction power losses $P_{Qx\_avg}$ and $P_{Qy\_pass}$ by the main switch Qx and the second switch Qy may be respectively calculated as $$\left(\frac{I_o^2 V_2}{V_{in} N}\right)^2 R_{sw}$$

and $$\left(\frac{I_o}{N}\right)^2 R_{sw},$$

and the total conduction power losses of the main switch Qx and the second switch Qy may be $$N\left(\frac{I_o^2 V_2}{V_{in} N}\right)^2 R_{sw}$$

and $$N\left(\frac{I_o}{N}\right)^2 R_{sw}.$$

In this case, the switching power losses $P_{Qx\_sw}$ and $P_{Qy\_sw}$ of the main switch Qx and the second switch Qy may be calculated as $$\frac{C_{sw}(V_{in} - V_2)^2}{T_{s1} M^2}$$

and $$\frac{C_{sw}}{T_{s2}}\left(\frac{V_2}{M} - I_o R_o\right)^2,$$

respectively. Here, it is assumed that the main switch Qx and the second switch Qy may use a single switching device, and a resistance of a switch and a capacitance of both ends of a switch are $R_{sw}$ and $C_{sw}$, respectively, to be equal to each other. The results described above are compared to those of the light source apparatus of FIG. 29 and the comparison results therefrom are shown in Table 3 below.

TABLE 3

| | General DC/DC Converter | | Embodiment | |
|---|---|---|---|---|
| Conduction Power Loss | $P_{Qpass} = \left(\frac{I_o^2 R_o}{V_{in}}\right)^2 R_{sw}$ | | $P_{Qx\_pass} = \left(\frac{I_o^2 V_2}{V_{in} N}\right)^2 R_{sw}$ | |
| | $P_{FWpass} = \left(I_o - \frac{I_o^2 R_o}{V_{in}}\right)^2 R_{sw}$ | | $P_{Qy\_pass} = \left(\frac{I_o}{N}\right)^2 R_{sw}$ | |
| Switching Power Loss | $P_{Qsw} = P_{FWsw} = \frac{C_{sw} V_{in}^2}{T_s}$ | | $P_{Qx\_sw} = \frac{C_{sw}(V_{in} - V_2)^2}{T_{s1} M^2}$ | |
| | | | $P_{Qy\_sw} = \frac{C_{sw}}{T_{s2}}\left(\frac{V_2}{M} - I_o R_o\right)^2$ | |

With reference to Table 3 above, it can be appreciated that the switching power loss is further reduced. In addition, driving circuits of the light source apparatus 500 may be distributed in each light emitting diode (541) unit, and the light diode 541 and the heat radiating plate may be shared, such that miniaturization and lightness of the light source apparatus 500 may be further enhanced.

Figure 24:
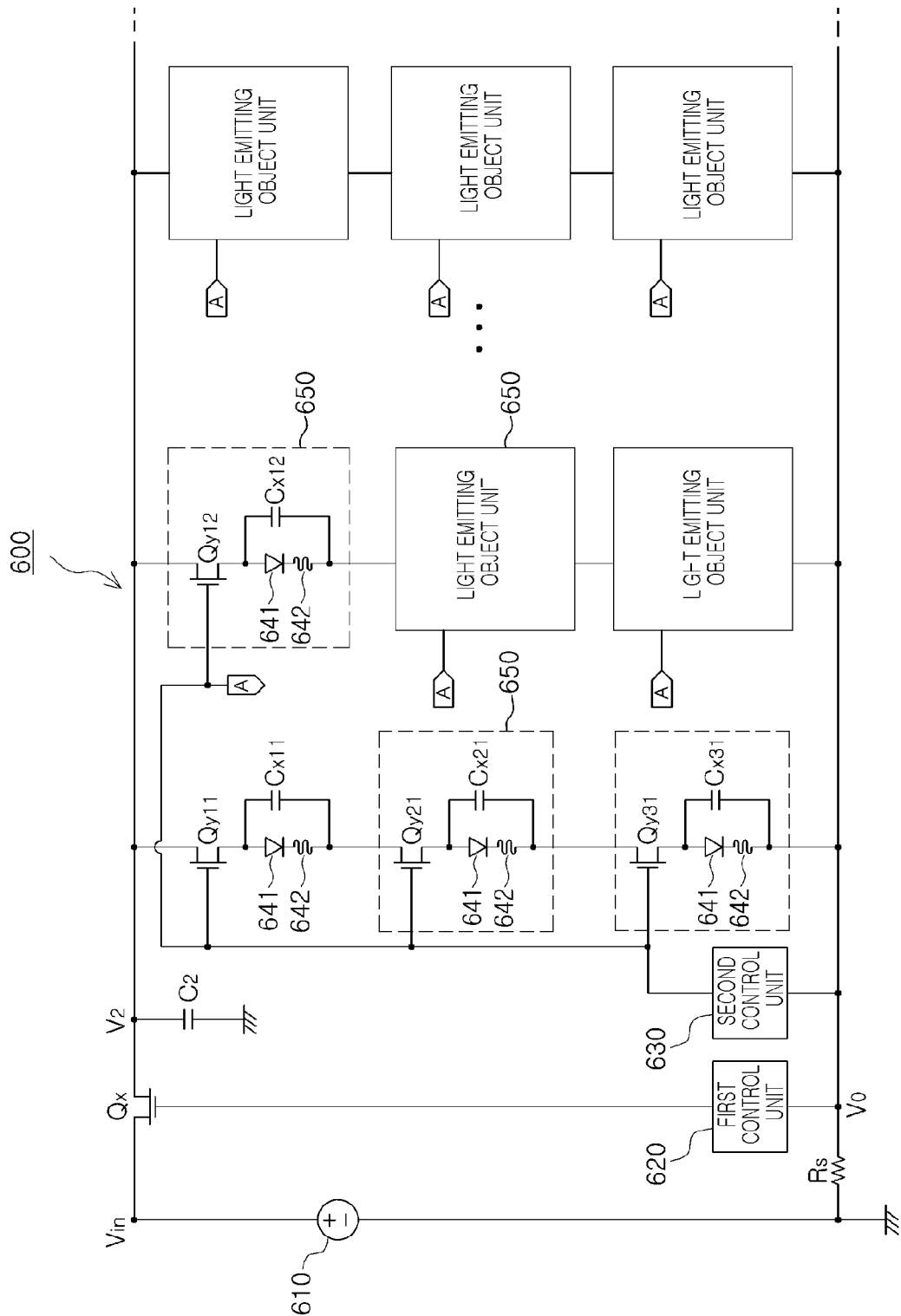

FIG. 24 is a circuit diagram of a light source apparatus 600 illustrating another example of the embodiment of FIG. 23.

With reference to FIG. 24, the light source apparatus 600 may include a main switch Qx and a plurality of light emitting objects 650 connected to one another in series and in parallel. The light source apparatus 600 may further include power source 610. Here, the light emitting object 650 may be defined as a set including an LED string 640, a capacitor Cx, and a second switch Qy, and here, this may be understood to have a type in which the main switch Qx is excluded from the light emitting series 550 defined in the embodiment of FIG. 23. That is, since the main switch Qx may not be provided for each light emitting object 650, the number of devices may be reduced. The light source apparatus 600 may further include first and second control units 620 and 630 respectively providing first and second switching control signals to the main switch Qx and the second switch Qy.

Figure 25:
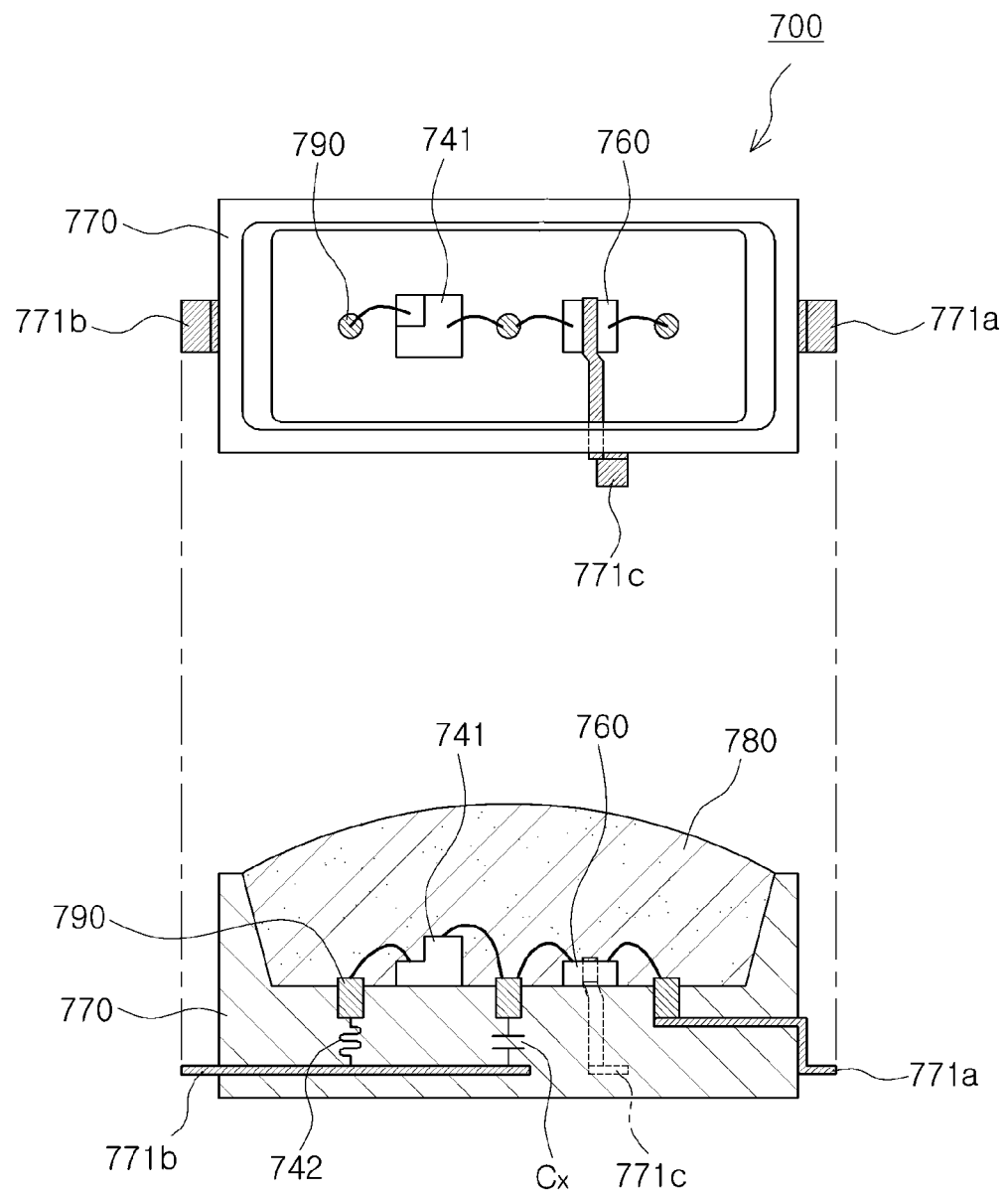
FIG. 25 provides a cross-sectional view and a plan view of a light emitting diode package according to an exemplary embodiment.

FIG. 25 illustrates a light emitting diode package 700 implemented by distributing driving circuits of a light source apparatus according to an exemplary embodiment in a package unit.

With reference to FIG. 25, the light emitting diode package 700 according to an exemplary embodiment may include a light emitting diode 741, a package substrate 770 and input and output terminals, and the input and output terminal may include three terminals, that is, an input terminal 771a, an output terminal 771b, and a control terminal 771c.

The light emitting diode 741, a semiconductor device emitting light having a predetermined wavelength by external power applied thereto, may have an anode terminal and a cathode terminal.

The package substrate 770 may include a capacitor Cx, an inductance unit 742, and a switching device 760. Although the capacitor Cx may be provided as an individual element on the package substrate 770, the capacitor Cx may be implemented as an embedded capacitor as described in the foregoing embodiment.

The inductance unit 742 may be equal to that described in the foregoing embodiment, and may be connected in series to any one of the anode terminal and the cathode terminal of the light emitting diode 741 such that an induced current can be generated according to a change in a current applied to the light emitting diode 741.

The switching device 760 may include one end, the other end, and a control signal input terminal, and may perform an on/off switching operation according to an electrical signal applied to the control signal input terminal so as to switching control the electrical signal applied to the light emitting diode 741, but is not limited thereto. A transistor may be used in a similar manner to the switch described in the foregoing embodiment, that is, the main switch Qx or the second switch Qy.

The input terminal 771a provided with the light emitting diode package 700 may be electrically connected to the anode terminal of the light emitting diode 741 so as to provide the electrical signal to the light emitting diode 741. The output terminal 771b provided with the light emitting diode package 700 may receive the electrical signal output from the cathode terminal of the light emitting diode 741. The input terminal 771a and the output terminal 771b may have a structure in which they are exposed to the outside from the package substrate 770 as shown in FIG. 25, and may have a structure in which they are respectively electrically connected to the anode terminal and the cathode terminal of the light emitting diode 741 through a lead-out conductor 790 of which at least a portion is embedded in the package substrate 770.

In addition, the light emitting diode package 700 may include the control terminal 771c, and the switching device 760 may receive a switching control signal applied externally through the control terminal 771c. Here, the input terminal 771a, the output terminal 771b and the control terminal 771c may be spaced apart from one another to be electrically isolated.

The light diode package 700 may contain a molding part 780 allowing the light emitting diode 741 to be embedded therein. The molding part 780 may be coated on an upper surface of the package substrate 770 to cover an upper surface and lateral surfaces of side portions of the light emitting diode 741, and may be formed of a resin obtained by mixing phosphors and silicon with each other at a predetermined ratio. The molding part may be formed to have a predetermined thickness by using one coating method of a squeegee, a screen printing method, a silk screen printing method, a stencil printing method, a dispensing method, and the like.

Figure 26:
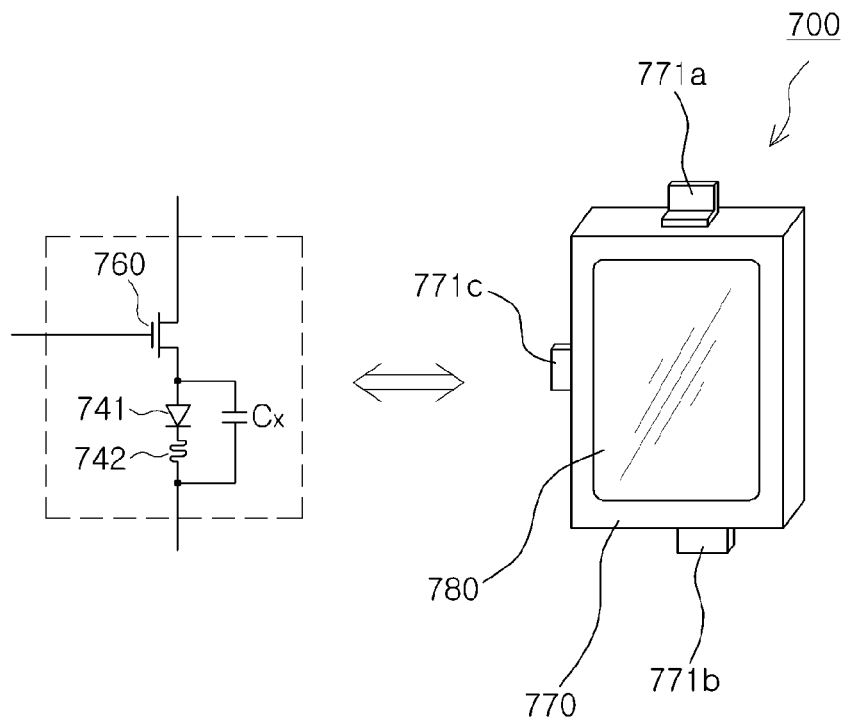
FIG. 26 illustrates a circuit included in the light emitting diode package of FIG. 25 according to the exemplary embodiment.

The circuit configuration of the light emitting diode package 600 according to the present embodiment will be described in more detail with reference to FIG. 26. Referring to FIG. 26, the light emitting diode 741 may be connected in parallel to the capacitor Cx with respect to the switching device 760, and at least one of the anode terminal and the cathode terminal of the light emitting diode 741 may be connected in series to the inductance unit. The switching device 760 may be connected to control the electrical signal that is transmitted through the input terminal 771a, the light emitting diode 741 and then the output terminal 771b. Meanwhile, the on/off switching operation of the switching device 760 may be performed by a switching control signal input from the outside to the switching device 760 through the control terminal 771c.

That is, the light emitting diode package 700 according to the present embodiment may be understood as the light emitting series 450 described with reference to FIG. 22 or the light emitting object 650 described with reference to FIG. 24 implemented in a light emitting diode package unit.

Figure 27:
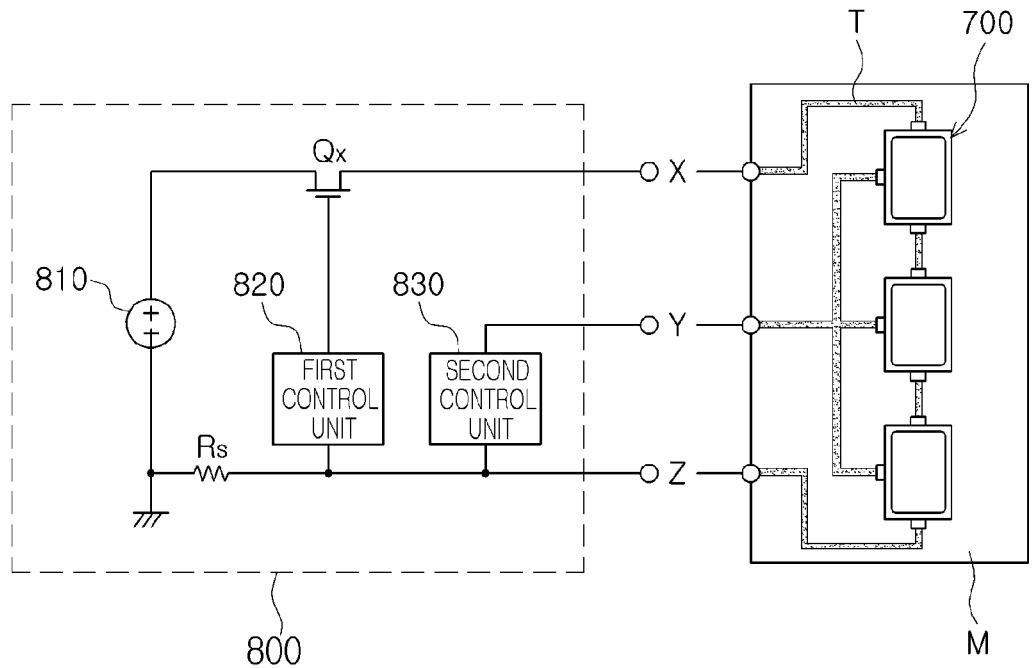
FIG. 27 illustrates an example of the light emitting diode package used according to the exemplary embodiment of FIG. 26.
Figure 28:
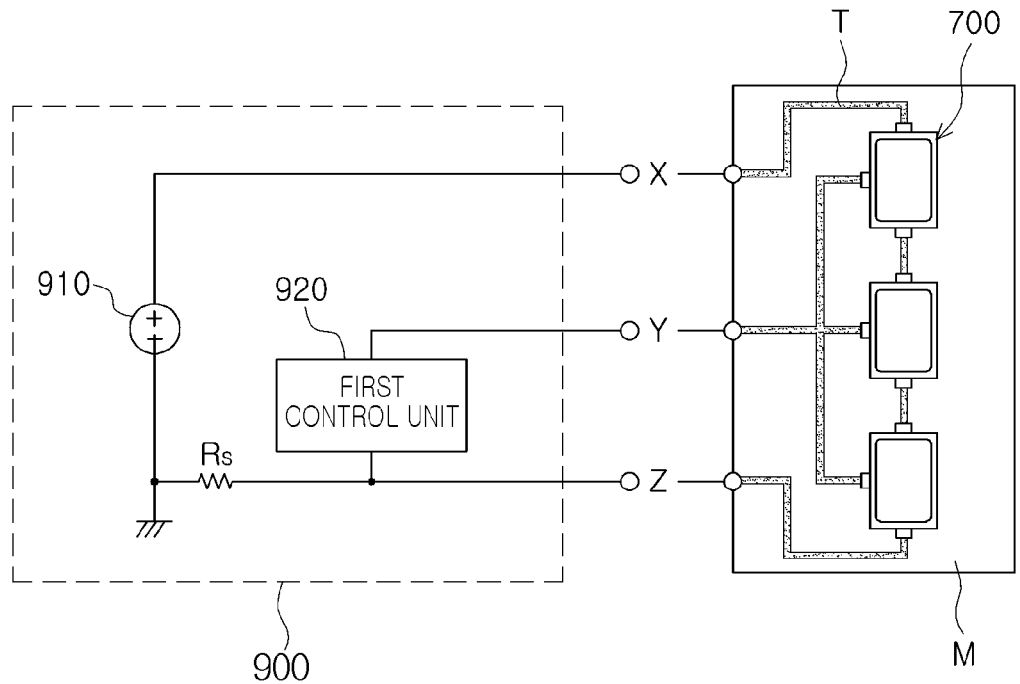
FIG. 28 illustrates another example of the light emitting diode package according to the exemplary embodiment of FIG. 26.

FIGS. 27 and 28 illustrate examples of the light emitting diode package 700 used according to the present embodiment. With reference to FIG. 27, a power circuit 800 may include a power source unit 810, a main switch Qx, and a first control unit 820 applying the first switching control signal to the main switch Qx so as to control a switching operation of the main switch Qx. In addition, the power circuit 800 may include a second control unit 830 outputting a second switching control signal, and three input/output terminals, X, Y and Z terminals. Here, the Y terminal is allocated to apply the second switching control signal to the switching device 760 included in the respective light emitting diode packages 700. The respective light emitting diode packages 700 may be mounted on the printed circuit board M having a conductive wire pattern T formed thereon, and may be connected to the input/output terminals X, Y and Z, respectively, through the conductive wire pattern T. According to the present embodiment, the driving circuits of the light source apparatus may be distributed in a package unit and thus, the light emitting diode package 700 only driven by a simple power circuit 800 may be obtained. In addition, the power circuit 800 does not include a separate inductor such that the dimension thereof can be reduced, and accordingly, a light source apparatus miniaturized by employing the light emitting diode package 700 may be obtained.

FIG. 28 illustrates an example of a variation of the light emitting diode package 700 of FIG. 27. With reference to FIG. 28, a power circuit 900 may include a power source unit 910 and a controller 920 outputting a first switching control signal for controlling a switching operation of the switching device 760 included in the respective light emitting diode packages 700. According to the present embodiment, the driving circuits may be distributed in a package unit and thus the light emitting diode package 700 only driven by a simple power circuit 900 may be obtained.

As set forth above, according to exemplary embodiments, a miniaturized light source apparatus having power consumption efficiency may be provided.

According to another exemplary embodiment, a light emitting diode package in which the light source apparatuses are distributed and embedded for respective packages may be provided.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

What is claimed is:

1. A light source apparatus comprising:
   at least one light emitting diode (LED) string including at least one light emitting diode and at least one inductance unit configured for generating an induced current according to a change in a current applied to the light emitting diode;

a main switch configured for controlling power applied to the LED string according to an on/off switching operation; and a capacitor charged with a voltage of the power applied to the LED string when the main switch is switched on and configured for applying the charged voltage to the LED string when the main switch is switched off, wherein the LED comprises:
 a light emitting laminate including a first conductivity-type semiconductor layer, an active layer, and a second conductivity-type semiconductor layer; and
 first and second electrodes electrically connected to the first conductivity-type semiconductor layer and the second conductivity-type semiconductor layer, respectively, wherein the first electrode includes a plurality of conductive vias connected to the first conductivity-type semiconductor layer through the second conductivity-type semiconductor layer and the active layer, a radius of each of the plurality of conductive vias ranges from 5 um to 50 μm, a space between conductive vias ranges from 100 μm to 500 μm, a sum total of the areas of the plurality of conductive vias in contact with the first conductivity-type semiconductor layer ranges from 1% to 5% of the area of the interface between the first conductivity-type semiconductor layer and the active layer, and the plurality of conductive vias are disposed in rows and columns within the light emitting laminate.

2. The light source apparatus of claim 1, wherein the LED further comprises:
 a phosphor layer disposed in a light output path of the LED,
 wherein the phosphor layer includes at least one phosphor selected from yellow, red, and green, and
 the phosphor is at least one of an oxide-based phosphor, a silicate-based phosphor, a nitride-based phosphor, and a sulfide-based phosphor.

3. The light source apparatus of claim 1, wherein the LED further comprises:
 a phosphor disposed in a light output path of the LED,
 wherein light output from the phosphor layer is white light,
 the white light has two or more peak wavelengths,
 (x,y) coordinates of the white light are positioned in a segment linking (x,y) coordinates (0.4476, 0.4074), (0.3484, 0.3516), (0.3101, 0.3162), (0.3128, 0.3292), (0.3333, 0.3333) in a CIE 1931 chromaticity diagram and black body radiation, and
 a color temperature of the white light corresponds to a range from 2,000K to 20,000K.

4. The light source apparatus of claim 1, wherein the LED and the main switch are mounted on a plate,
 wherein the plate comprises:
 a metal support substrate;
 an insulating layer formed on the metal support substrate; and
 at least one of a conductive pattern and a copper foil laminated on the insulating layer.

5. A light source apparatus of claim 1, comprising:
 at least one light emitting diode (LED) string including at least one light emitting diode and at least one inductance unit configured for generating an induced current according to a change in a current applied to the light emitting diode;

a main switch configured for controlling power applied to the LED string according to an on/off switching operation; and a capacitor charged with a voltage of the power applied to the LED string when the main switch is switched on and configured for applying the charged voltage to the LED string when the main switch is switched off, wherein the LED comprises:
 a substrate;
 a base layer formed on the substrate;
 a plurality of nano-light emitting structures formed on the base layer and including a first conductivity type nano-core, an active layer, and a second conductivity type semiconductor layer; and
 a filler material filling gaps between the plurality of nano-light emitting structures.

6. The light source apparatus of claim 5, wherein the LED further comprises:
 a phosphor layer disposed in a light output path of the LED,
 wherein the phosphor layer includes at least one phosphor selected from yellow, red, and green, and
 the phosphor is at least one of an oxide-based phosphor, a silicate-based phosphor, a nitride-based phosphor, and a sulfide-based phosphor.

7. The light source apparatus of claim 5, wherein the LED further comprises:
 a phosphor disposed in a light output path of the LED,
 wherein light output from the phosphor layer is white light,
 the white light has two or more peak wavelengths,
 (x,y) coordinates of the white light are positioned in a segment linking (x,y) coordinates (0.4476, 0.4074), (0.3484, 0.3516), (0.3101, 0.3162), (0.3128, 0.3292), (0.3333, 0.3333) in a CIE 1931 chromaticity diagram and black body radiation, and
 a color temperature of the white light corresponds to a range from 2,000K to 20,000K.

8. The light source apparatus of claim 5, wherein the LED and the main switch are mounted on a plate,
 wherein the plate comprises:
 a metal support substrate;
 an insulating layer formed on the metal support substrate; and
 at least one of a conductive pattern and a copper foil laminated on the insulating layer.

9. A light source apparatus of comprising:
 at least one light emitting diode (LED) string including at least one light emitting diode and at least one inductance unit configured for generating an induced current according to a change in a current applied to the light emitting diode;

a main switch configured for controlling power applied to the LED string according to an on/off switching operation; and a capacitor charged with a voltage of the power applied to the LED string when the main switch is switched on and configured for applying the charged voltage to the LED string when the main switch is switched off, wherein the LED comprises:
 a first conductivity type semiconductor layer and a second conductivity type semiconductor layer;
 an active layer interposed between the first and second conductivity type semiconductor layers; and
 first and second electrodes electrically connected to the first and second conductivity type semiconductor layers, respectively, wherein at least one of the first and second electrodes includes a plurality of laminated metal layers including different elements.

10. The light source apparatus of claim 9, wherein the LED further comprises:
a phosphor layer disposed in a light output path of the LED, wherein the phosphor layer includes at least one phosphor selected from yellow, red, and green, and
the phosphor is at least one of an oxide-based phosphor, a silicate-based phosphor, a nitride-based phosphor, and a sulfide-based phosphor.

11. The light source apparatus of claim 9, wherein the LED further comprises:
a phosphor disposed in a light output path of the LED, wherein light output from the phosphor layer is white light, the white light has two or more peak wavelengths,
(x,y) coordinates of the white light are positioned in a segment linking (x,y) coordinates (0.4476, 0.4074), (0.3484, 0.3516), (0.3101, 0.3162), (0.3128, 0.3292), (0.3333, 0.3333) in a CIE 1931 chromaticity diagram and black body radiation, and
a color temperature of the white light corresponds to a range from 2,000K to 20,000K.

12. The light source apparatus of claim 9, wherein the LED and the main switch are mounted on a plate,
wherein the plate comprises:
a metal support substrate;
an insulating layer formed on the metal support substrate; and
at least one of a conductive pattern and a copper foil laminated on the insulating layer.

* * * * *